(12) United States Patent
Miura

(10) Patent No.: US 7,328,311 B2
(45) Date of Patent: Feb. 5, 2008

(54) MEMORY CONTROLLER CONTROLLING CASHED DRAM

(75) Inventor: Seiji Miura, Hachioji (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/155,504

(22) Filed: Jun. 20, 2005

(65) Prior Publication Data

US 2005/0232060 A1 Oct. 20, 2005

Related U.S. Application Data

(63) Continuation of application No. 10/457,609, filed on Jun. 10, 2003, now Pat. No. 6,928,003.

(30) Foreign Application Priority Data

Jun. 28, 2002 (JP) ............................ P2002-189513

(51) Int. Cl.
*G06F 12/00* (2006.01)

(52) U.S. Cl. ...................... 711/118; 711/119; 711/144; 711/145; 711/105

(58) Field of Classification Search ...................... None
See application file for complete search history.

(56) References Cited

U.S. PATENT DOCUMENTS

| | | | |
|---|---|---|---|
| 5,822,772 A | 10/1998 | Chan et al. | |
| 5,848,428 A | 12/1998 | Collins | |
| 5,983,313 A | 11/1999 | Heisler et al. | |
| 5,983,325 A | 11/1999 | Lewchuk | |
| 6,333,873 B1 | 12/2001 | Kumanoya et al. | |
| 6,381,671 B1 | 4/2002 | Ayukawa et al. | |
| 6,415,353 B1 | 7/2002 | Leung | |
| 6,473,828 B1 | 10/2002 | Matsui | |
| 6,629,207 B1 * | 9/2003 | Yoshioka et al. ........... 711/125 |
| 2002/0003741 A1 | 1/2002 | Maesako et al. | |
| 2002/0023197 A1 | 2/2002 | Miura et al. | |

FOREIGN PATENT DOCUMENTS

| | | |
|---|---|---|
| JP | 11-86532 | 3/1999 |
| JP | 2000-21160 | 1/2000 |

* cited by examiner

*Primary Examiner*—Donald Sparks
*Assistant Examiner*—Horace L. Flournoy
(74) *Attorney, Agent, or Firm*—Mattingly, Stanger, Malur & Brundidge, P.C.

(57) ABSTRACT

According to the semiconductor device and method of the present invention, because regular cache memories subjected to hit checks are distinguished from spare cache memories not subjected to hit checks, and because sense amplifiers are also used as cache memories, built-in cache memories are operated faster and at low power consumption. A memory control unit is capable of distinguishing regular memories subjected to hit checks and spare memories not subjected to hit checks. This way, if a hit check is a miss, one of the cache memories not subjected to a hit checks is subjected to a subsequent hit operation and another one of the cache memories not subjected to hit checks is not subjected to the next hit check operation.

13 Claims, 26 Drawing Sheets

H:High
L:Low

FIG.10

| BANK | TRAD[12] | TRAD[11:0] | SGAD | CHAD | DT | VL |
|---|---|---|---|---|---|---|
| 0 | 0 | 1 | 1 | 0 | H | H |
| | | 10 | 2 | 1 | H | H |
| | | 11 | 3 | 2 | H | H |
| | | 20 | 0 | 3 | L | L |
| | 1 | 33 | 2 | 4 | H | H |
| | | 45 | 3 | 5 | H | H |
| | | 32 | 0 | 6 | H | H |
| | | 27 | 1 | 7 | L | L |
| 1 | 0 | 16 | 3 | 8 | H | H |
| | | 3 | 2 | 9 | H | H |
| | | 47 | 1 | 10 | H | H |
| | | 55 | 0 | 11 | L | L |
| | 1 | 100 | 3 | 12 | H | H |
| | | 111 | 2 | 13 | H | H |
| | | 123 | 2 | 14 | H | H |
| | | 255 | 0 | 15 | L | L |

H:High
L:Low

FIG.13A

| CACHE HIT/MISS | HIT | MISS (Clean) | MISS (Dirty) |
|---|---|---|---|
| CMD FLOW | RD | AC ↓ PF ↓ RD ↓ PRE | AC ↓ PF ↓ RD ↓ PRE ↓ RT ↓ AC ↓ PRE |
| RLAT | 2 | 6 | 6 |
| RPW | 0.25 | 1.0 | 1.8 |

FIG.13B

| CACHE HIT/MISS | HIT | MISS (Clean) | MISS (Dirty) |
|---|---|---|---|
| CMD FLOW | WT | AC ↓ PF ↓ WT ↓ PRE | AC ↓ PF ↓ WT ↓ PRE ↓ RT ↓ AC ↓ PRE |
| WLAT | 0 | 4 | 4 |
| WPW | 0.25 | 1.0 | 1.8 |

FIG.18

| MASTER | BANK | TRAD[12:0] | SGAD | CHAD | DT | VL |
|---|---|---|---|---|---|---|
| MS0 | 0 | 1 | 1 | 0 | H | H |
| | 1 | 10 | 2 | 1 | H | H |
| | 0 | 11 | 3 | 2 | H | H |
| | 1 | 20 | 0 | 3 | L | L |
| MS1 | 1 | 33 | 2 | 4 | H | H |
| | 0 | 45 | 3 | 5 | H | H |
| | 0 | 32 | 0 | 6 | H | H |
| | 1 | 27 | 1 | 7 | L | L |
| MS2 | 0 | 16 | 3 | 8 | H | H |
| | 0 | 3 | 2 | 9 | H | H |
| | 1 | 47 | 1 | 10 | H | H |
| | 1 | 55 | 0 | 11 | L | L |
| PCI | 1 | 100 | 3 | 12 | H | H |
| | 0 | 111 | 2 | 13 | H | H |
| | 1 | 123 | 2 | 14 | H | H |
| | 0 | 255 | 0 | 15 | L | L |

H:High
L:Low

H:High
L:Low

FIG.22A

| BANK | TRAD[12:0] | SGAD | CHAD | DT | VL | WTH |
|---|---|---|---|---|---|---|
| 0 | 0 | 2 | 0 | H | H | L |
| | 3 | 3 | 1 | H | H | L |
| | 11 | 3 | 2 | H | H | L |
| | 20 | 0 | 3 | H | H | L |
| | 33 | 2 | 4 | H | H | L |
| | 45 | 3 | 5 | H | H | L |
| | 32 | 0 | 6 | H | H | L |
| | 27 | 1 | 7 | L | H | H |
| 1 | 16 | 3 | 8 | H | H | L |
| | 3 | 2 | 9 | H | H | L |
| | 47 | 1 | 10 | H | H | L |
| | 55 | 0 | 11 | H | H | L |
| | 100 | 3 | 12 | H | H | L |
| | 111 | 2 | 13 | H | H | L |
| | 123 | 2 | 14 | H | H | L |
| | 255 | 0 | 15 | L | H | H |

H:High
L:Low

FIG.22B

| BANK | TRAD[12:0] | SVL |
|---|---|---|
| 0 | 27 | H |
| 1 | 255 | H |

H:High
L:Low

FIG.24

| WBCH HIT/MISS | HIT1 | MISS1 | | MISS1 (Clean) | | MISS1 (Dirty) | |
|---|---|---|---|---|---|---|---|
| WTCH HIT/MISS | — | HIT2 | MISS2 | MISS2 | | MISS2 | |
| SA HIT/MISS | — | — | HIT3 | MISS3 | | MISS3 | |
| SA STATE | — | ACT | ACT | ACT | INACT | ACT | INACT |
| ROW HIT/MISS | — | — | — | — | — | HIT4 | MISS4 | MISS4 |
| CMD FLOW | WT | WT↓RT | PF↓WT↓RT | PRE↓AC↓PF↓WT | AC↓PF↓WT | RT↓PRE↓AC↓PF↓WT | PRE↓RT↓AC↓PRE↓AC↓PF↓WT | RT↓AC↓PRE↓AC↓PF↓WT |
| DEST | WBCH | WTCH ARY | WTCH ARY | WBCH | WBCH | WBCH ARY | WBCH ARY | WBCH ARY |
| WLAT | 0 | 0 | 2 | 6 | 4 | 8 | 12 | 10 |
| WPW | 0.25 | 0.35 | 0.5 | 1.0 | 0.9 | 1.2 | 1.8 | 1.7 |

FIG.25

| CACHE HIT/MISS | HIT1 | MISS1 | MISS1 (Clean) | | MISS1 (Dirty) | |
|---|---|---|---|---|---|---|---|
| BUF HIT/MISS | — | HIT2 | MISS2 | MISS2 | | MISS2 | |
| SA HIT/MISS | — | — | HIT3 | MISS3 | | MISS3 | |
| SA STATE | — | — | ACT | ACT | INACT | ACT | INACT |
| ROW HIT/MISS | — | — | — | — | — | HIT4 | MISS4 | MISS4 |
| CMD FLOW | RD | RD | PF ↓ RD | PRE ↓ AC ↓ PF ↓ RD | AC ↓ PF ↓ RD | RT ↓ PRE ↓ AC ↓ PF ↓ RD | PRE ↓ RT ↓ AC ↓ PRE ↓ AC ↓ PF ↓ RD | RT ↓ AC ↓ PRE ↓ AC ↓ PF ↓ RD |
| SORS | WBCH | WTCH | WTCH | WBCH | WBCH | WBCH ARY | WBCH ARY | WBCH ARY |
| RLAT | 2 | 2 | 4 | 8 | 6 | 10 | 14 | 12 |
| RPW | 0.25 | 0.25 | 0.5 | 1.0 | 0.9 | 1.2 | 1.8 | 1.7 |

FIG.30A

| ICH/DCH HIT/MISS | IHIT | IMISS | DHIT | DMISS (Clean) | DMISS (Dirty) |
|---|---|---|---|---|---|
| CMD FLOW | RD | AC↓PF↓RD↓PRE | RD | AC↓PF↓RD↓PRE | AC↓PF↓RD↓PRE↓RT↓AC↓PRE |
| SORS | ICH | ICH | DCH | DCH | DCH ARY |
| RLAT | 2 | 6 | 2 | 6 | 6 |
| RPW | 0.25 | 1.0 | 0.25 | 1.0 | 1.8 |

FIG.30B

| DCH HIT/MISS | DHIT | DMISS (Clean) | DMISS (Dirty) |
|---|---|---|---|
| CMD FLOW | WT | AC↓PF↓WT↓PRE | AC↓PF↓WT↓PRE↓RT↓AC↓PRE |
| DEST | DCH | DCH | DCH ARY |
| WLAT | 0 | 4 | 4 |
| WPW | 0.25 | 1.0 | 1.8 |

FIG.32A

| CACHE HIT/MISS | DHIT | DHIT | | DMISS | | |
|---|---|---|---|---|---|---|
| SA HIT/MISS | SAHIT | SAMISS | | SAHIT | SAMISS | |
| SA STATE | ACT | ACT | INACT | ACT | ACT | INACT |
| CMD FLOW | WT↓RT | WT↓PRE↓RT↓AC | WT↓RT↓AC | PF↓WT↓RT | PRE↓AC↓PF↓WT↓RT | AC↓PF↓WT↓RT |
| DEST | DCH ARY | DCH | DCH | DCH ARY | DCH | DCH |
| WLAT | 0 | 0 | 0 | 2 | 6 | 4 |
| WPW | 0.35 | 0.9 | 0.8 | 0.5 | 1.0 | 0.9 |

FIG.32B

| CACHE HIT/MISS | IHIT | DHIT | IMISS or DMISS | | |
|---|---|---|---|---|---|
| SA HIT/MISS | — | — | SAHIT | SAMISS | |
| SA STATE | — | — | ACT | ACT | INACT |
| CMD FLOW | RD | RD | PF↓RD | PRE↓AC↓PF↓RD | AC↓PF↓RD |
| DEST | ICH | DCH | ICH or DCH | ICH or DCH | ICH or DCH |
| RLAT | 2 | 2 | 4 | 8 | 6 |
| RPW | 0.25 | 0.25 | 0.5 | 1.0 | 0.9 |

# MEMORY CONTROLLER CONTROLLING CASHED DRAM

CROSS-REFERENCES

This is a continuation application of U.S. Ser. No. 10/457,609, filed Jun. 10, 2003 (now U.S. Pat. No. 6,928,003).

BACKGROUND OF THE INVENTION

1. Field of the Invention

The present invention relates to a memory controlling method. More particularly, the present invention relates to an information processing system having devices accessing memories (DRAM, etc.) such as CPUs, etc., a memory control circuit to be accessed from those devices and controlling the memories (DRAM, etc.), and memories (DRAM, etc.).

2. Description of Related Art

Conventional DRAMs have a plurality of DRAM memory banks and a plurality of cache memory SRAMs, that is, DRAMs with built-in cache memories. Such a DRAM is disclosed in the official gazette [document 1] of JP-A 86532/1999.

Another conventional DRAM is disclosed in the official gazette [document 2] of JP-A No. 21160/2000. This document discloses a method which enables each DRAM sense amplifier to function as a cache memory.

Prior to this application, the present inventor has examined a DRAM with built-in cache memories and controlling methods for the DRAM.

The information processing system has a device for accessing DRAMs such as a CPU, etc. and a control unit controlling the DRAMs, and a plurality of such DRAMs.

The DRAM stores programs to be executed by the CPU, data to be processed by the CPU, etc.

FIG. 2 shows a memory module MEM configured by eight SDRAMs, each having a capacity of 128 M bits and an I/O line of 8-bit width. SDRAM has by two memory banks B0 and B1 and a cache memory block CACHE. Each memory bank has a row decoder X-DEC, a segment decoder SG-DEC, a memory cell array ARY, and a sense amplifier SA. The sense amplifier SA can retain data of one page (819 bits).

The cache memory block CACHE has a cache decoder CH-DEC, a column decoder Y-DEC, and 16 cache memories CH15 to CH0. Each cache memory can retain data of 2048 bits.

At first, a method for reading data from such an SDRAM will be described with reference to FIG. 3. A bank active command AC, a bank address BK0, and a row address R0 are inputted to select a memory bank and a word line in the memory bank. Then, data of one page (819 bits) read from the memory cell array ARY is transferred to the sense amplifier SA and retained there.

Then, a pre-fetch command PF, a bank address BK0, a segment address SG0, and a cache address CH0 are inputted to transfer data of 2048 bits to a cache specified by a cache address CH0 and retained there. The 2048-bit data is included in the data retained in the sense amplifier SA in the selected bank and specified by a segment address SG0.

Then, data retained in the cache memory specified by the read command RD, the cache address CH0, and the column address C0 is read sequentially in units of 8 bits. If the clock cycle at that time is assumed as T, the read latency becomes 6T.

Finally, the selected word line in the memory bank specified by the pre-charge command PRE and the bank address BK0 is inactivated, then the SA is inactivated.

In this regard, the data in the cache memory is retained even while the data retained in the sense amplifier SA is erased by the pre-charge command PRE erases.

If the CPU accesses the SDRAM and the bank address, the row address, and the segment address specified for the access are identical to those of the data retained in the cache memory at that time, the CPU can read the data directly from the cache memory, thereby increasing access speed.

FIG. 4 shows a method for writing 4-burst data in a cache memory CH0 of the SDRAM.

According to this method, data is written in the addresses C0, C0+1, C0+2, and C0+3 in the cache memory CH0 specified by a write command, a cache address CH0, and a column address C0 sequentially in units of 8 bits. The write latency in this case becomes 0T.

Once data is written in the cache CH0, the data matching between the memory cell array ARY and the cache memory CH0 is lost. To keep the data matching even in such a case, the data in the cache memory CH0 must be written back to the memory cell array ARY beforehand.

FIG. 5 shows a method for writing back data from a cache memory in an SDRAM to the memory cell array ARY.

At first, a restore command RST, a bank address BK0, a cache address CH0, and a segment address SG0 are inputted to prepare data to be written in the memory cell array ARY. Then, a bank active command AC, a bank address BK0, and a row address R0 are inputted to select a word line in the specified memory bank and activate the sense amplifier SA, thereby the data is written in the memory cell through the ense amplifier SA.

Finally, a pre-charge command PRE and a bank address BK0 are inputted to inactivate the word line in the specified memory bank, and then inactivate the sense amplifier SA.

FIG. 6 shows a timing chart of a read operation attempted once for the cache memory CH0 after new data is written therein. In this case, however, the requested data is not found there. If new data is written only in the cache memory CH0, the data matching between the cache memory CH0 and the memory cell array ARY is lost. In order to keep the data matching between the two even in such a case, the data in the cache memory CH0 must be written back to the memory cell array ARY prior to the read operation.

When writing back data to the memory cell array ARY from the cache memory CH0, a restore command RST, a bank address BK0, a cache address CH0, and a segment address SG0 are inputted first to prepare the data to be written in the memory cell array ARY. Then, a bank active command AC, a bank address BK0, and a row address R0 are inputted to select a word line in the specified memory bank and activate the sense amplifier SA, thereby the data is written in the memory cell array ARY through the sense amplifier SA.

Finally, a precharge command PRE and a bank address are inputted to inactivate the word line in the memory bank, and then inactivate the sense amplifier SA.

Next, a description will be made for how the requested data is read.

At first, a bank active command AC, a bank address BK0, and a row address R1 are inputted to select a memory bank and a word line in the memory bank, so that 819-bit data, which is one page data retained in the memory cell array ARY, is transferred to the sense amplifier SA, then retained there.

Then, a prefetch command RF, a bank address BK0, a segment address SG0, and a cache address CH0 are inputted to transfer 2048-bit data specified by the segment address SG0 from among the data retained in the sense amplifier SA of the selected bank to the cache memory CH0 specified by the cache address CH0, then retained there.

After that, a read command RD, a cache address CH0, and a column address C0 are inputted to read data from the specified cache memory CH0.

Finally, a precharge command PRE and a bank address are inputted to inactivate the word line in the memory bank, and then inactivate the sense amplifier SA.

If the requested data is not found in the cache memory CH0 and the requested data must be written back to the cache memory CH0 as described above, it will take 14 cycles of time to read the data. The reading speed will thus slow down. Furthermore, there is the problem that the SDRAM power consumption increases.

Under such circumstances, it is an object of the present invention to provide a method for increasing the speed of both reading from and writing to the DRAM while reducing power consumption. It is also an object of the present invention to provide a semiconductor device that can realize the same advantages.

SUMMARY OF THE INVENTION

In order to achieve the above object, the present invention uses the following representative methods.

<Controlling Changes of Cache Memories>

This method divides cache memories into two types; cache memories subjected to cache hit checks and spare ones not subjected to cache hit checks, or adds a spare cache memory not subjected to cache hit checks to a DRAM embedded with cache memories. Since when a cache memory is missed at a hit check in a read operation in response to a read request received from external to the DRAM and the data must be written back to the cache memory, first data is transferred to the spare cache memory, and then read therefrom. After that, the data retained in the missed cache memory is written back to the DRAM array. Furthermore, the spare cache memory that retains the transferred data is changed to a cache memory subjected to hit checks, and the missed cache memory is changed to a spare one.

<Using Both Cache Memory and Sense Amplifier Cache>

This method uses both cache memory embedded in a DRAM and the sense amplifier provided in each bank as cache memories.

By keeping the sense amplifier activated and by having the data retained in the sense amplifier, a sense amplifier can be used as a cache memory.

BRIEF DESCRIPTION OF THE DRAWINGS

FIG. 10 is an example of DRAM address information retained by a hit check circuit HJ to make hit checks;

FIGS. 13A and 13B are sequences of commands for reading and writing data by the memory control unit MCU from/to the DRAM module MEM;

FIG. 18 is an example of DRAM address comparing information retained by the hit check circuit HJ1 to make hit checks;

FIG. 22 is an example of DRAM address comparing information retained by the hit check circuit HJ2 to make hit checks;

FIG. 24 is a sequence of commands issued by the memory control unit MCU2 to the DRAM module MEM to write data therein;

FIG. 25 is a sequence of commands issued by the memory control unit MCU2 to the DRAM module MEM to read data therefrom;

FIG. 30 is a sequence of commands issued by the memory control unit MCU3 to the DRAM module MEM to read/write data therefrom/therein;

FIG. 32 is a sequence of commands issued by the memory control unit MCU3 to the DRAM module MEM to read/write data therefrom/therein.

DETAILED DESCRIPTION OF THE PREFERRED EMBODIMENTS

First Embodiment

Figure 1:
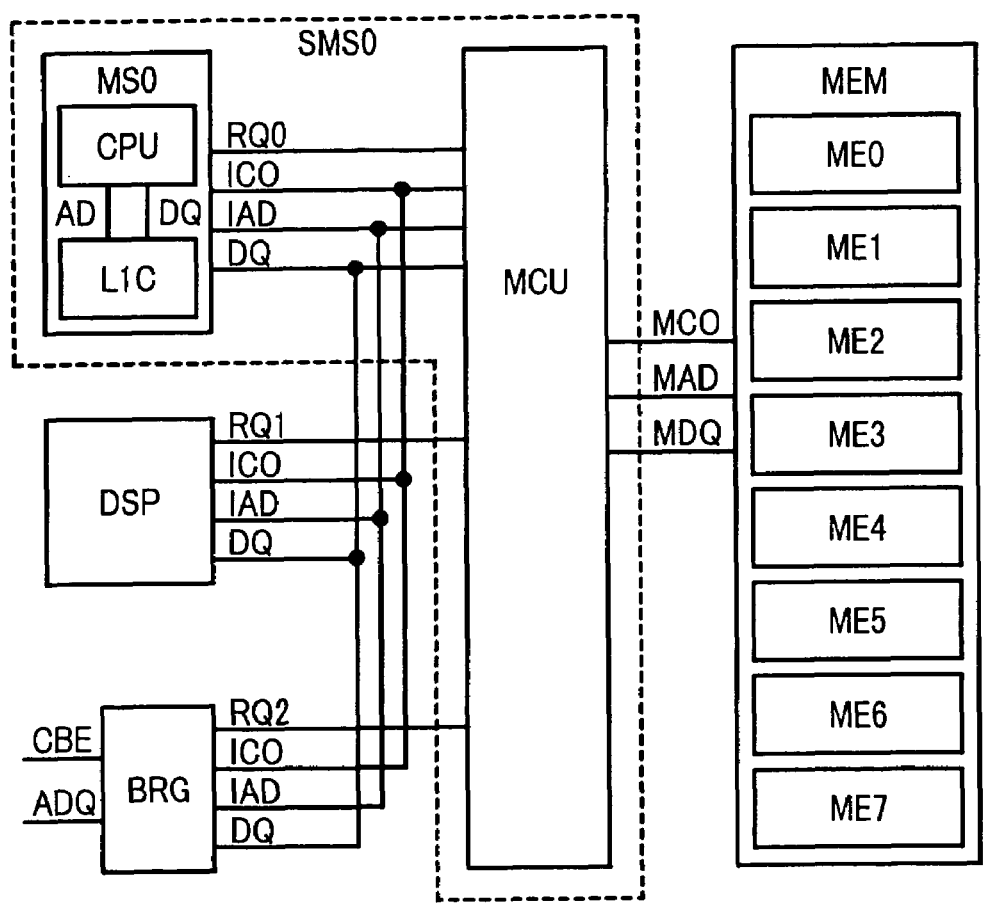
FIG. 1 is a block diagram of an information processing system of the present invention.
Figure 2:
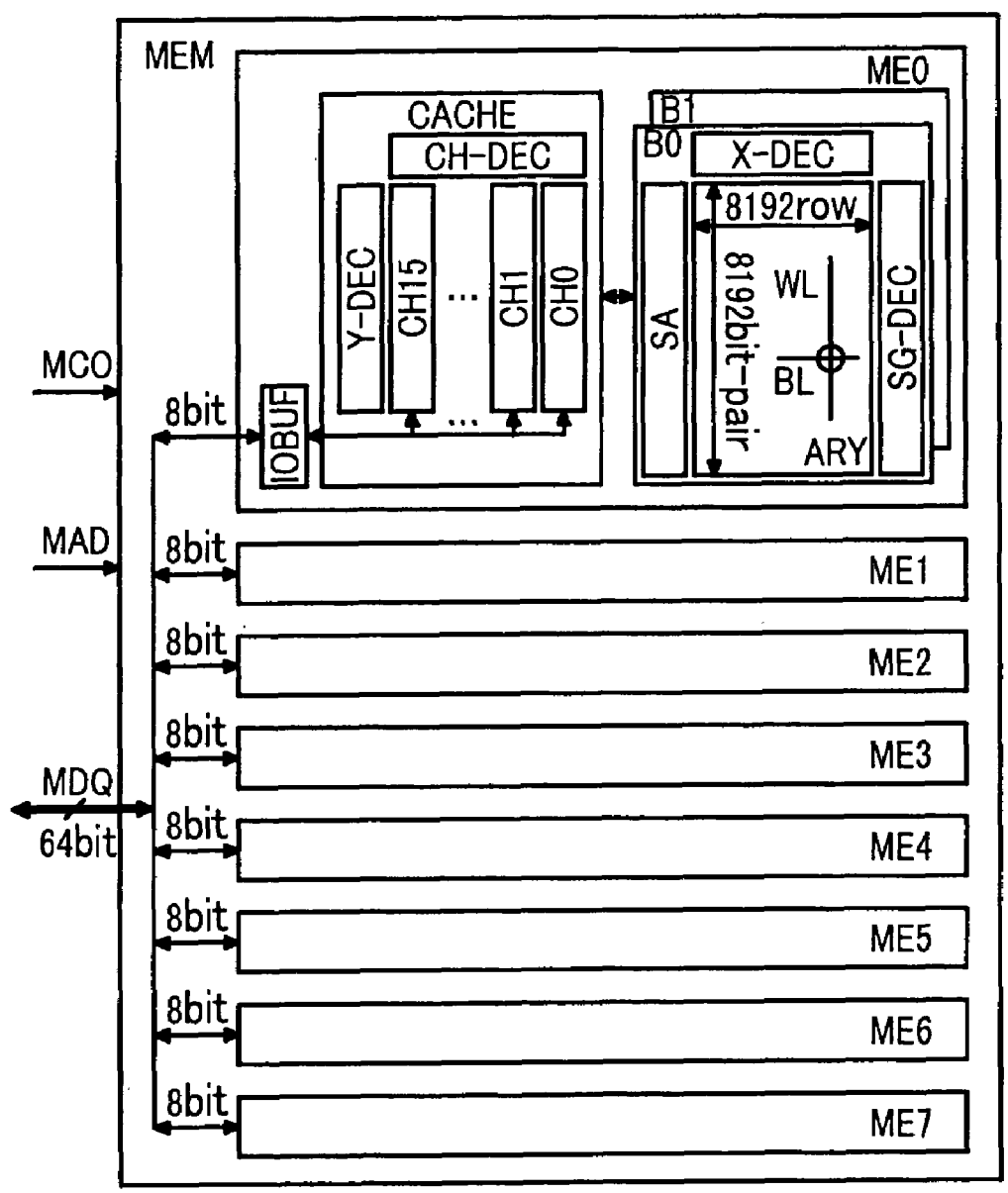
FIG. 2 is a block diagram of a memory module that uses a plurality of DRAMs, each including built-in cache memories.
Figure 3:
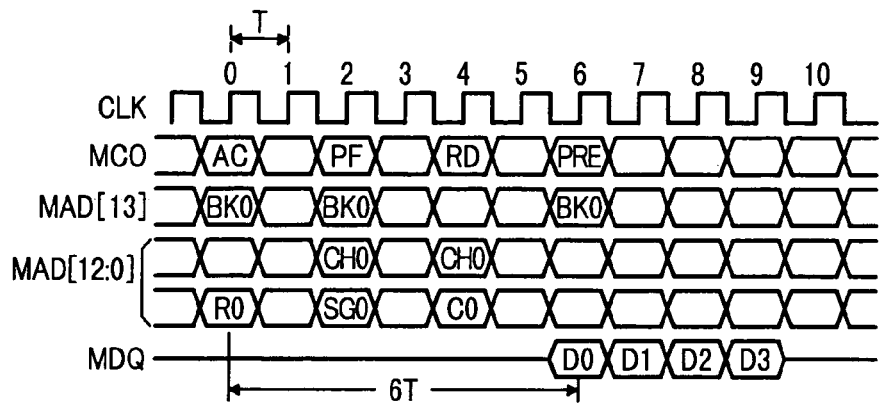
FIG. 3 is a timing chart of a read operation by the memory module shown in FIG. 2.
Figure 4:
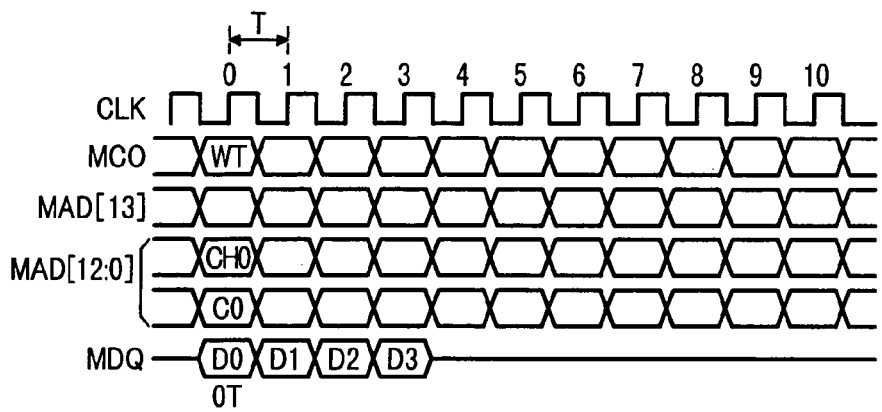
FIG. 4 is a timing chart of a write operation by the memory module shown in FIG. 2.
Figure 5:
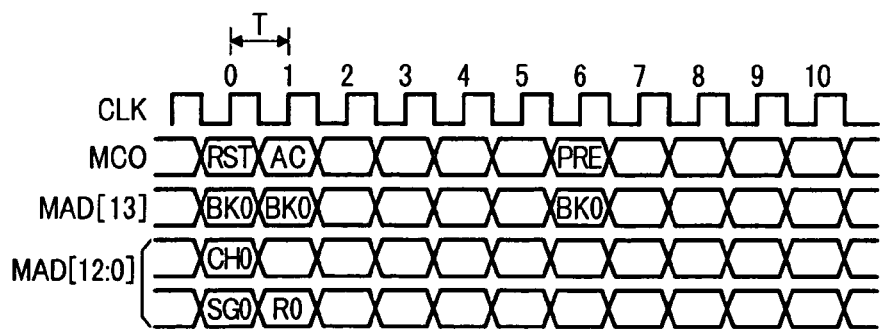
FIG. 5 is a timing chart of a write-back operation by the memory module shown in FIG. 2.
Figure 6:
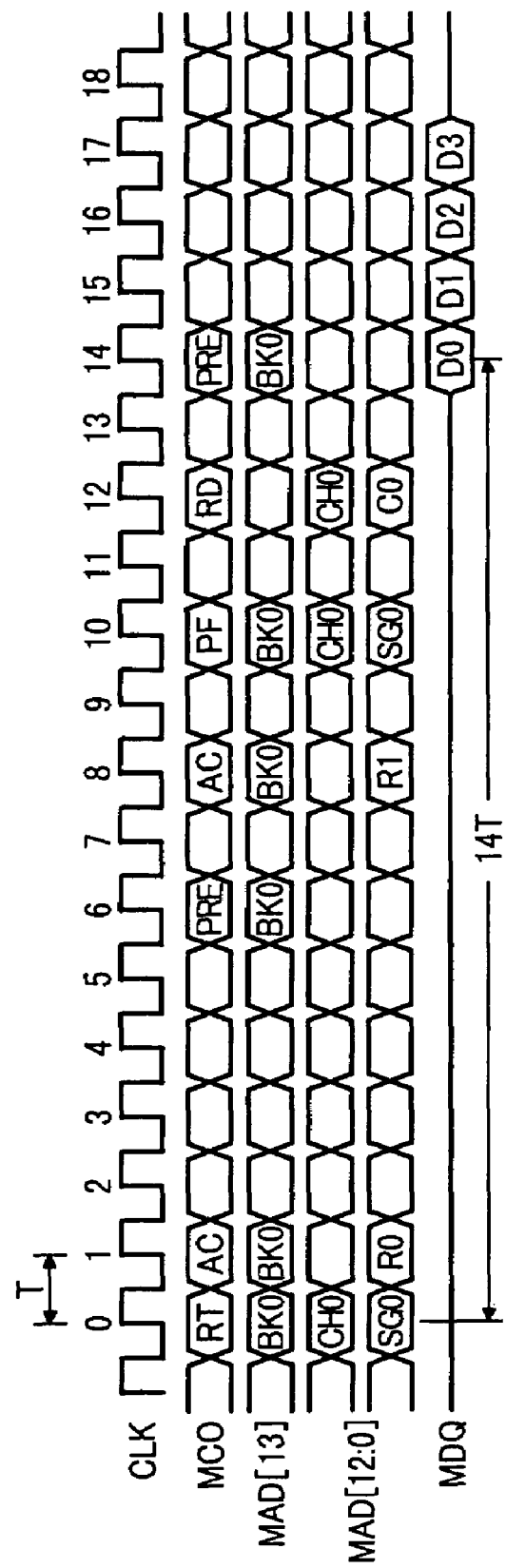
FIG. 6 is a timing chart of another read operation by the memory module shown in FIG. 2.

FIG. 1 shows a basic block diagram of an information processing system of the present invention.

The information processing system has an information processing unit MS0 that includes a central processing unit (CPU) and a primary cache memory L1C; a DRAM module MEM configured by a plurality of DRAMs, including a plurality of built-in cache memories; a memory control unit MCU for controlling the DRAM module MEM; a digital processor DSP; and a PCI bridge circuit BRG. This information processing system operates synchronously with a clock CLK. Although not limited specially, the information processing unit MS0 and the memory control unit MCU may be provided on the same substrate so as to realize the information processing system SMS0.

The PCI bridge circuit BRG is provided with a PCI interface. The memory control unit MCU receives access requests from the information processing unit MS0, the digital signal processor DSP, and the PCI bridge circuit BRG and controls the DRAM module MEM.

The DRAM module MEM has eight memories (the first memory ME0, the second memory ME1, the third memory ME2, the fourth memory ME3, the fifth memory ME4, the sixth memory ME5, the seventh memory ME6, and the eighth memory ME7). Each memory has 16 cache memories and two memory banks, each memory bank is an SDRAM provided with a sense amplifier.

Although not limited specially, the information processing unit MS0 is capable of managing the address space with use of a 32-bit address signal and the DRAM module MEM is managed by the information processing unit MS0.

The operation of the information processing unit MS0 will now be explained.

Read requests from MS0, DSP, and BRG are inputted to the memory control unit MCU through RQ0, RQ1, and RQ2. The memory unit control unit MCU enables only one of the three requests, which is received from the CPU. The CPU then outputs a read command according to command signal IC0 and an address according to the address signal IAD to the memory control unit MCU. The memory control unit MCU, after receiving the read command and the address from the information processing unit MS0, outputs the read command according to memory address signal MC0 and the address according to memory address signal MA0 to the DRAM module MEM, data is output from the MDQ of the DRAM module MEM and transferred to MS0 through DQ.

Figure 7:
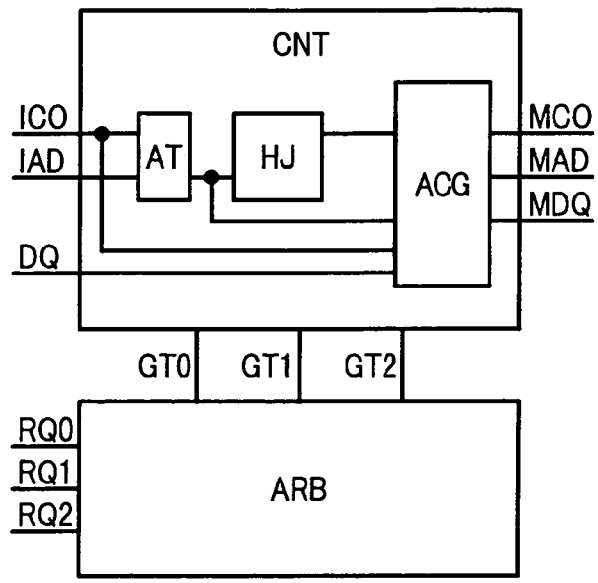
FIG. 7 shows an embodiment of the present invention.

FIG. 7 shows a block diagram of the memory control unit MCU of the present invention.

This circuit has an access arbitration circuit ARB for arbitrating among access requests to the DRAM module MEM and memory control circuit CNT.

The arbitration circuit ARB receives access requests RQ0 to RQ2 from MS0, DSP, and BRG and enables each of the accesses according to the priority decided by the arbitration circuit ARB.

The memory control circuit CNT has address convert circuit AT, a hit check circuit HJ, and an address/command generation circuit ACG.

The address convertion circuit AT transforms the address of enabled access into addresses of a bank, row, segment, column, and cache address of.

The hit check circuit HJ makes a hit/miss check if an address transformed by the address convert circuit AT hits the target cache memory in the specified DRAM and makes a clean/dirty check for the data matching between the hit cache memory (CH0 to CH15) in the DRAM and the memory cell array ARY. If the result of the check result is "clean", it means that data matching is maintained. If the result of the check result is "dirty", it means that the data matching is lost there between.

The address/command generation circuit ACG outputs memory address MAD0 from memory command signal MC0 controlling the DRAM module MEM according to the check result of the hit check circuit HJ, and transfers the data through an input/output signal MDQ.

Figure 8:
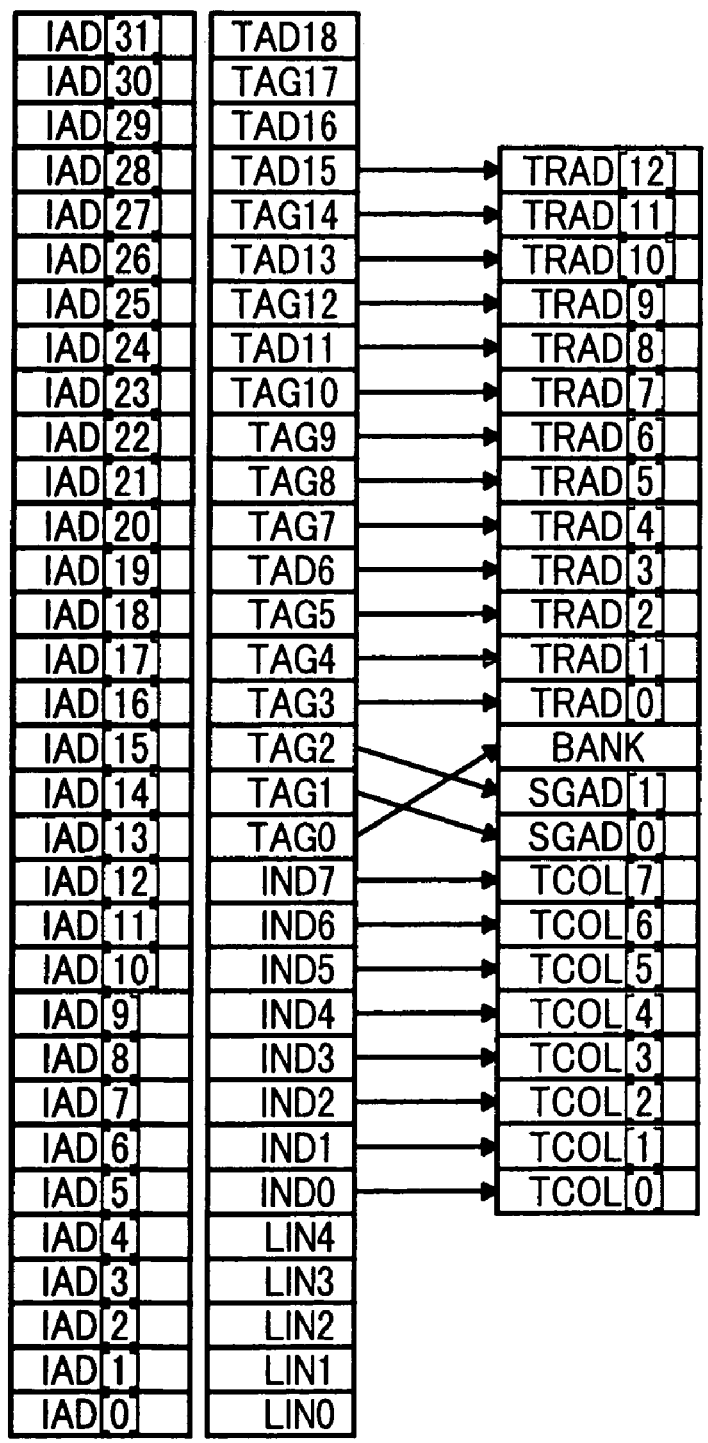
FIG. 8 is a chart for describing address translation by an address convert circuit.

FIG. 8 shows a chart for describing address convertion by the address convert circuit AT.

The IAD[31:0] is an address to be inputted to the memory control circuit CNT.

LIN0 to LIN4 are line sizes of the L1 cache L1C and IND0 to IND7 are index addresses of the L1 cache L1C. TAG0 to TAG15 are tag addresses of the L1 cache L1C.

IAD[4:0] corresponds to LIN0 to LIN4 and IAD[12:5] corresponds to IND0 to IND7, IAD[31:13] corresponds to TAG18 to TAG0, and are inputted to the memory control circuit CNT.

The address convert circuit AT transforms the addresses IAD[31:0] into column addresses (TCOL[0] to TCOL[7]), segment addresses (SGAD[0] to SGAD[1]), bank address (BANK), and row addresses (TRAD[0] to TRAD[12]) respectively.

The IAD[5:12] is transformed into column addresses (TCOL[0] to TCOL[7]. The IAD[13] is transformed into a bank address BANK. The IAD[14:15] is transformed into segment addresses SGAD[0] to SGAD[1]. And, the IAD [16:31] is transformed into row addresses TRAD[0] to TRAD[12].

Figure 9:
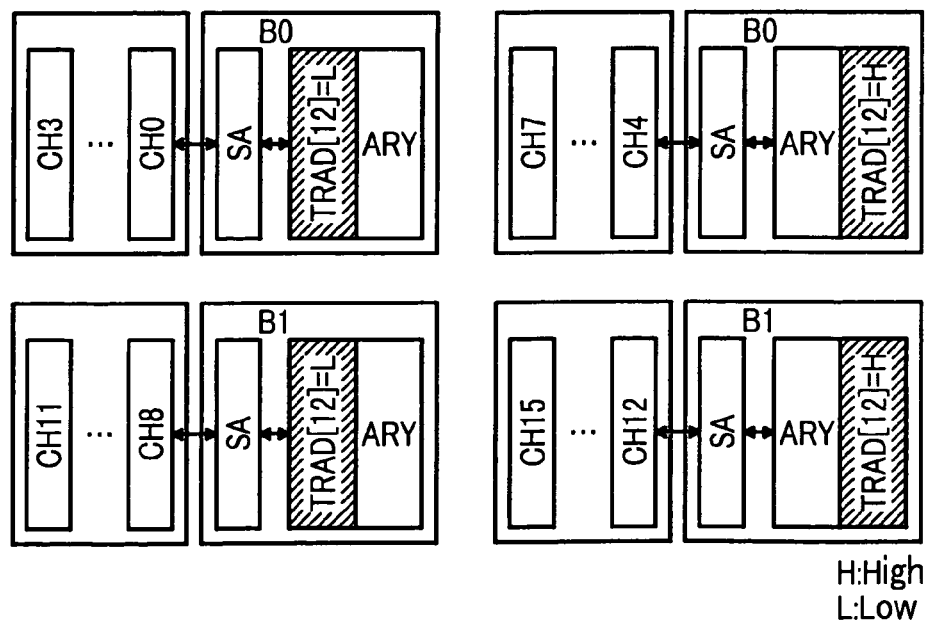
FIG. 9 is an example of allocation of built-in cache memories by the memory control unit MCU.

FIG. 9 shows charts for describing an example of how the memory control circuit CNT allocates cache memories built in the DRAM.

As shown in FIG. 9, the four cache memories CH0 to CH3 are allocated to an area where the row address TRAD[12] is low in the bank 0 (B0) and the four cache memories CH4 to CH7 are allocated to an area where the row address TRAD [12] is high in the bank 0 (B0). And, the four cache memories CH8 to CH11 are allocated to an area where the row address TRAD[12] is low in the bank 1 (B1) and the four cache memories CH12 to CH15 are allocated to an area where the row address TRAD[12] is high in the bank 1 (B1).

Because the cache memories are allocated as described above, part of the data retained in the bank 0 can be retained in the cache memories CH0 to CH7 while part of the data retained in the bank 1 can be retained in the cache memories CH8 to CH15 respectively.

The cache memories CH0 to CH3 are formed in the same hierarchical position and no duplicated address is allocated against the memory bank. The cache memories CH4 to CH7, CH8 to CH11, and CH12 to CH15 are also formed in the same hierarchical position similarly.

FIG. 10 shows an example of DRAM address comparing information retained by the hit check circuit HJ to make hit checks.

In FIG. 10, reference symbols are defined as follows; BANK is bank address, TRAD[12:0] is row address, SGAD is segment address, CHAD is cache memory address, DT is dirty bit, and VL is valid bit.

The value 0 of a cache memory address CHAD corresponds to the cache memory CH0, meaning that the cache memory CH0 retains data having a bank address of 0, a row address TRAD[12] of 0, a row address TRAD[11:0] of 1, and a segment address of 1.

The value 1 of a cache memory address CHAD corresponds to the cache memory CH1, meaning that the cache memory CH1 retains data having a bank address of 0, a row address TRAD[12] of 0, a row address TRAD[11:0] of 10, and a segment address of 2.

The value 2 of a cache memory address CHAD corresponds to the cache memory CH2, meaning that the cache memory CH2 retains data having a bank address of 0, a row address TRAD[12] of 0, a row address TRAD[11:0] of 11, and a segment address of 3.

The value 3 of a cache memory address CHAD corresponds to the cache memory CH3, meaning that the cache memory CH3 retains data having a bank address of 0, a row address TRAD[12] of 0, a row address TRAD[11:0] of 20, and a segment address of 0.

The value 4 of a cache memory address CHAD corresponds to the cache memory CH4, meaning that the cache memory CH4 retains data having a bank address of 0, a row address TRAD[12] of 1, a row address TRAD[11:0] of 33, and a segment address of 2.

The value 5 of a cache memory address CHAD corresponds to the cache memory CH5, meaning that the cache memory CH5 retains data having a bank address of 0, a row address TRAD[12] of 1, a row address TRAD[11:0] of 45, and a segment address of 3.

The value 6 of a cache memory address CHAD corresponds to the cache memory CH6, meaning that the cache memory CH6 retains data having a bank address of 0, a row address TRAD[12] of 1, a row address TRAD[11:0] of 32, and a segment address of 0.

The value 7 of a cache memory address CHAD corresponds to the cache memory CH6, meaning that the cache memory CH6 retains data having a bank address of 0, a row address TRAD[12] of 1, a row address TRAD[11:0] of 27, and a segment address of 1.

The value 8 of a cache memory address CHAD corresponds to the cache memory CH8, meaning that the cache memory CH8 retains data having a bank address of 1, a row address TRAD[12] of 0, a row address TRAD[11:0] of 16, and a segment address of 3.

The value 9 of a cache memory address CHAD corresponds to the cache memory CH9, meaning that the cache memory CH9 retains data having a bank address of 1, a row address TRAD[12] of 0, a row address TRAD[11:0] of 3, and a segment address of 2.

The value 10 of a cache memory address CHAD corresponds to the cache memory CH10, meaning that the cache memory CH10 retains data having a bank address of 1, a row address TRAD[12] of 0, a row address TRAD[11:0] of 47, and a segment address of 1.

The value 11 of a cache memory address CHAD corresponds to the cache memory CH11, meaning that the cache memory CH11 retains data having a bank address of 1, a row address TRAD[12] of 0, a row address TRAD[11:0] of 55, and a segment address of 0.

The value 12 of a cache memory address CHAD corresponds to the cache memory CH12, meaning that the cache memory CH12 retains data having a bank address of 1, a row address TRAD[12] of 1, a row address TRAD[11:0] of 100, and a segment address of 3.

The value 13 of a cache memory address CHAD corresponds to the cache memory CH13, meaning that the cache memory CH13 retains data having a bank address of 1, a row address TRAD[12] of 1, a row address TRAD[11:0] of 111, and a segment address of 2.

The value 14 of a cache memory address CHAD corresponds to the cache memory CH14, meaning that the cache memory CH14 retains data having a bank address of 1, a row address TRAD[12] of 1, a row address TRAD[11:0] of 123, and a segment address of 2.

The value 15 of a cache memory address CHAD corresponds to the cache memory CH15, meaning that the cache memory CH15 retains data having a bank address of 1, a row address TRAD[12] of 1, a row address TRAD[11:0] of 255, and a segment address of 0.

When the dirty bit DT in a cache memory is Low, it means that data matching is kept between the cache memory and the DRAM array. When the dirty bit DT is High, it means that the data matching is lost from between them. Because the dirty bit DT of each of the cache memory addresses CHAD 0, 1, 2, 4, 5, 6, 8, 9, 10, 12, 13, and 14 is High, data matching is lost from between the DRAM array and the cache memories CH0 to CH2, CH4 to CH6, CH8 to CH10, and CH12 to CH14.

Because the dirty bits DT of each of the cache memory addresses CHAD 3, 8, 11, and 15 is Low, data matching is kept between the DRAM array and the cache memories CH3, CH8, CH11, and CH15.

When the parity bit VL in a cache memory is High, it means that the cache memory is subjected to hit checks. When the parity bit VL is Low, it means that the cache memory is a spare one not subjected to any hit check. Because the parity bit VL of each of the cache memory addresses CHAD 3, 8, 11, and 15 is Low, it means that the cache memories CH3, CH8, CH11, and CH15 are all spare ones.

Figure 11:
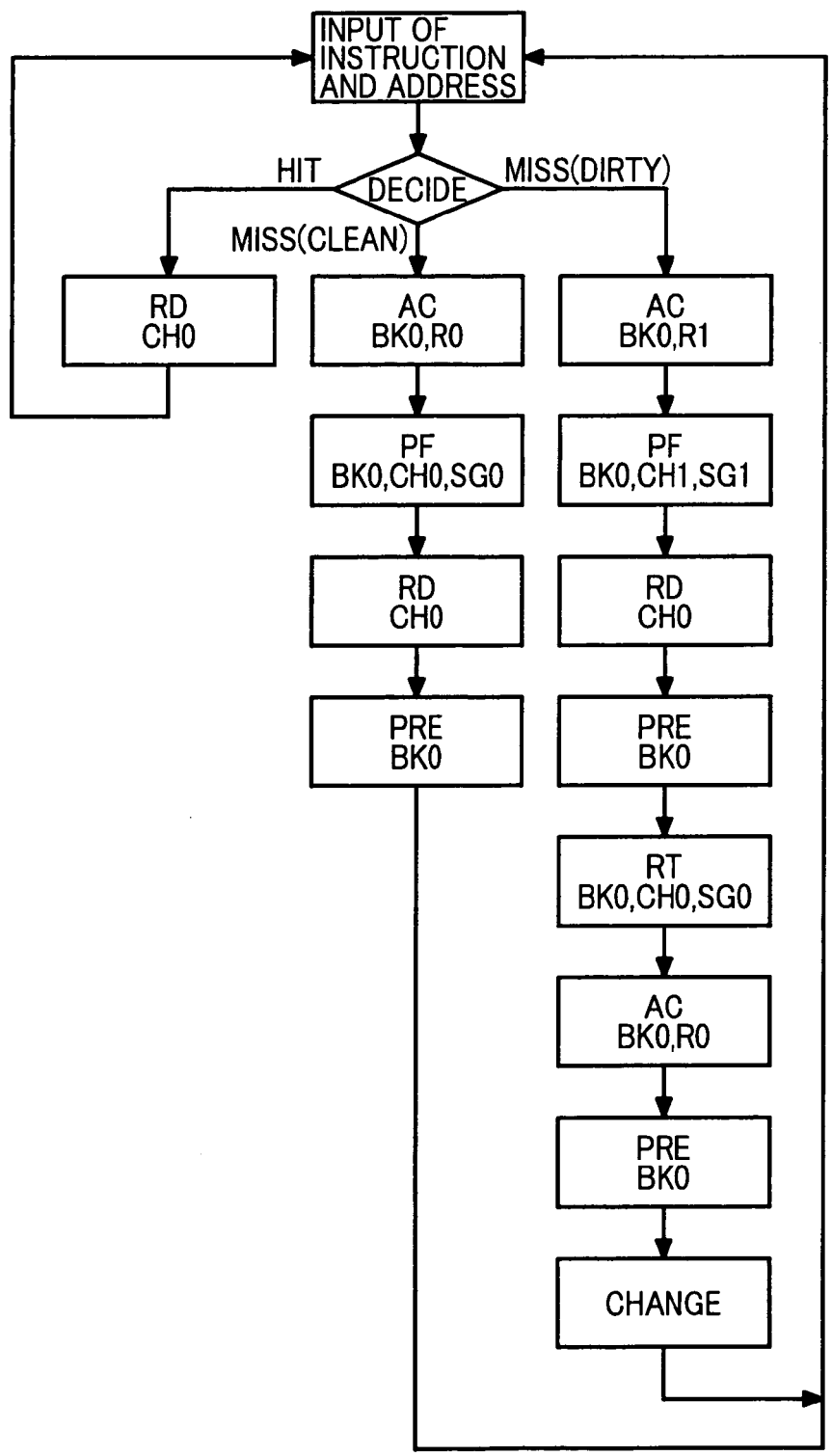
FIG. 11 is a flowchart of data reading by the memory control circuit CNT.

FIG. 11 shows a sequence of data read operations performed in the memory control circuit CNT.

Figure 12A:
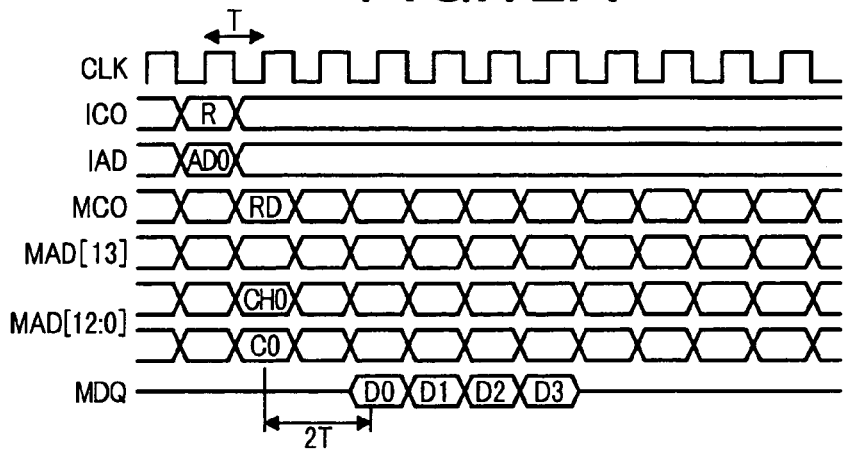
FIGS. 12A through 12C are waveforms to be output to the DRAM module MEM from the memory control unit MCU.

FIG. 12A shows an operation waveform output by the memory control circuit CNT to the RAM module MEM when the cache CH0 is hit.

Figure 12B:
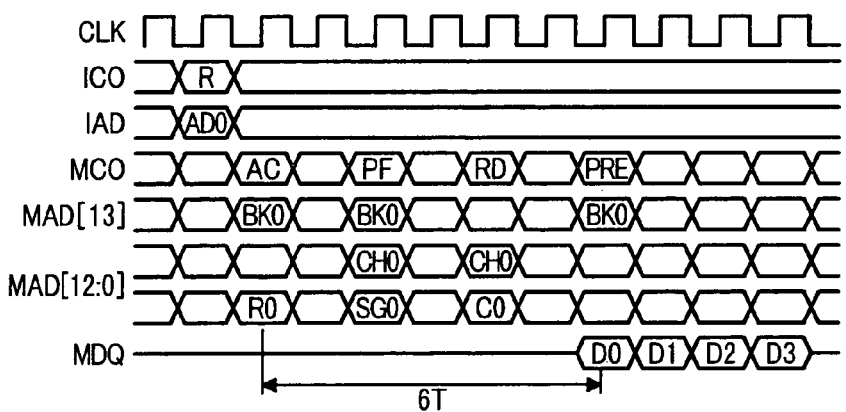

FIG. 12B shows an operation waveform output by the memory control circuit CNT to the DRAM module MEM when the cache memory CH0 is missed, but the cache memory is "clean", which means that data matching is kept between the cache memory CH0 and the DRAM bank.

Figure 12C:
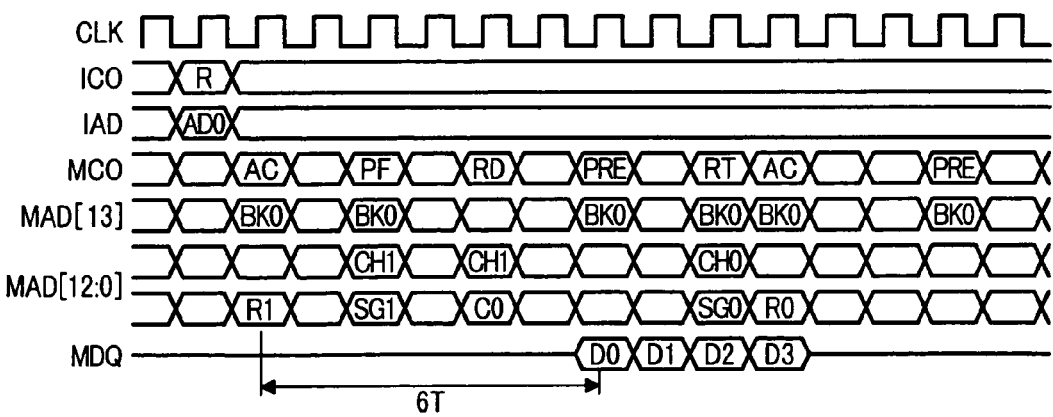

FIG. 12C shows an operation waveform output by the memory control circuit CNT to the DRAM module MEM when the cache memory CH0 is missed, and the cache memory is "dirty" which means that data matching is lost from between the cache memory CH0 and the DRAM bank.

The memory control circuit CNT, when receiving a command and an address, performs a hit check against the cache memories. If it hits the cache memory CH0, the memory control circuit CNT outputs a read command RD, a cache memory address CH0, and a column address C0 to read the data from the cache memory CH0 directly, then outputs a precharge command PRE. The read latency at that time becomes 2T if the clock cycle is assumed as T.

If it misses the cache memory CH0, but is "clean", which means that data matching is kept between the cache memory CH0 and the DRAM bank, the memory control circuit CNT transfers the data from the memory cell array to the cache memory CH0, thereby the data is read therefrom.

To transfer data to the cache memory CH0 as described above, at first the memory control circuit CNT outputs a bank active command AC, a bank address BK0, a row address R0, then a prefetch command RF, another bank address BK0, a cache memory address CH0, and a segment address SG0 to the DRAM module MEM. After that, the memory control circuit CNT output a read command RD, a cache memory address CH0, and a column address C0 to the MEM to read data from the cache memory CH0. Finally, the memory control circuit CNT outputs a precharge command PRE and a bank address BK0 to the DRAM module MEM. The read latency at this time becomes 6T.

If it misses the cache memory CH0 and is "dirty", which means that data matching is lost from between the cache memory CH0 and the DRAM bank, the memory control circuit CNT transfers the data to another cache memory, which is a spare one, thereby the data is read therefrom. After that, the memory control circuit CNT writes back the data retained in the missed cache memory CH0 to the DRAM bank. Finally, the memory control circuit CNT issues a cache change command CHANGE to set High for the valid signal VL of the cache memory, which is currently a spare one, to change the cache memory to a regular one to be subjected to hit checks. Then, the memory control circuit CNT sets Low for the valid signal VL of the missed cache memory to change the cache memory to a spare one.

To transfer data to the cache memory CH1, which is a spare one, the memory control circuit CNT outputs a bank active command AC, a bank address BK0, a row address R1, then a prefetch command RF, a bank address BK0, a cache memory address CH1, and a segment address SG1 to the DRAM module MEM. After that, the memory control circuit CNT output a read command RD, a cache memory address CH1 that is a spare one, and a column address C0 to the DRAM module MEM to read data from the cache memory CH1. Finally, the memory control circuit CNT outputs a precharge command PRE and a bank address BK0 to the DRAM.

After that, the memory control circuit CNT outputs a restore command RT, a bank address BK0, a cache memory address CH0, and a segment address SG0 to the DRAM module MEM to write back the data from the missed cache memory CH0 to the DRAM bank. Then, the memory control circuit CNT outputs a bank active command AC, a bank address BK0, and a row address R0 to the DRAM module MEM. Finally, the memory control circuit CNT outputs a precharge command PRE and a bank address BK0 to the DRAM module MEM.

Finally, the memory control circuit CNT issues a cache change command CHANGE to drive the valid signal VL of the cache memory CH1 (a spare one) into High, thereby changing the cache memory to a regular one to be subjected to hit checks. After that, the valid signal VL of the missed cache memory CH0 is driven into Low so that the cache memory is changed to a spare one. Because the DRAM is provided with a spare cache memory and requested data is transferred to the spare cache memory before reading the data, the read latency is suppressed to 6T.

While four spare cache memories are added to the regular cache memories built in a DRAM in FIG. 10, the same effect is also obtained even when only one spare cache is added to those regular cache memories, of course. Furthermore, the same effect is also obtained only by adding a spare cache memory to a DRAM with built-in cache memories.

FIG. 13 shows a sequence of commands CMD issued by the memory control unit MCU to read and write data from/in the DRAM module MEM together with both latency RLAT and power RPW of the DRAM module MEM at that time.

FIG. 13A shows both latency RLAT and power RPW of the DRAM module MEM from which data is read.

When it hits the cache memory, the memory control unit MCU outputs a read command RD to the DRAM module, thereby the read latency RLAT and the power RPW of the DRAM module MEM become 2 cycles and 0.25 respectively.

When it misses the cache memory, but is "clean", the memory control unit MCU outputs a bank active command AC, a prefetch command PF, a read command RD, and a precharge command PRE to the DRAM module MEM, thereby both read latency RLAT and power RPW of the DRAM module MEM become 6 cycles and 1.0 respectively.

When it misses the cache memory, and is "dirty", the memory control unit MCU outputs a bank active command AC, a prefetch command PF, a read command RD, and a precharge command PRE to the DRAM module MEM, thereby the read latency RLAT of the DRAM MEM becomes 6 cycles. After that, the memory control unit MCU outputs a restore command RT, a bank active command AC, and a precharge command PRE to the DRAM module MEM to write back the requested data. As a result, the read latency RLAT and the power RPW of the DRAM module MEM become 6 cycles and 1.8 respectively.

FIG. 13B shows both write latency WLAT and power WPW of the DRAM module MEM when data is written to the DRAM module MEM.

When it hits the cache memory, the memory control unit MCU outputs a write command WT to the DRAM module, thereby the write latency WLAT and power WPW of the DRAM module MEM become 0 cycle and 0.25 respectively.

When it misses the cache memory, but and is "clean", the memory control unit MCU outputs a bank active command AC, a prefetch command PF, a write command WT, and a precharge command PRE to the DRAM module, thereby the write latency WLAT and the power WPW of the DRAM module become 4 cycles and 1.0 respectively.

When it misses the cache memory, and is "dirty", the memory control unit MCU outputs a bank active command AC, a prefetch command PF, a write command WT, and a precharge command PRE to the DRAM module, thereby the read latency RLAT of the DRAM module becomes 4 cycles. After that, the memory control unit MCU outputs a restore command RT, a bank active command AC, and a precharge command PRE to the DRAM module to write back the requested data. As a result, the write latency WLAT and the power WPW of the DRAM module MEM become 4 cycles and 1.8 respectively.

Figure 14:
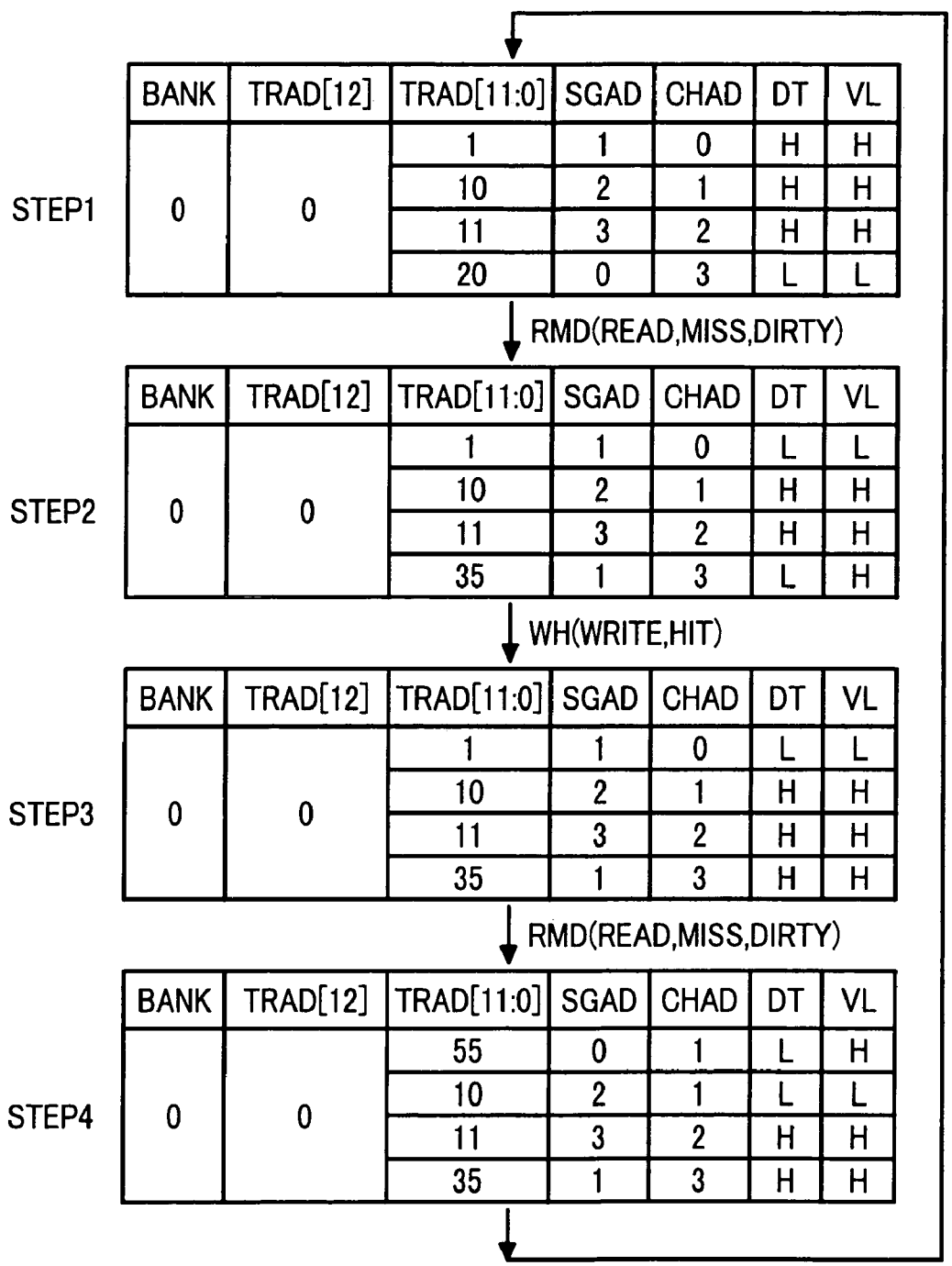
FIG. 14 is charts for describing the changes of the DRAM address comparing information retained by the hit check circuit HJ to make hit checks.

FIG. 14 shows an example of changes of the DRAM addresses corresponding to the data retained in the cache memories CH0 to CH3. The DRAM addresses are the DRAM addresses retained by the memory control unit MCU shown in FIG. 10 so as to perform hit checks.

Because addresses of other cache memories are also changed similarly, this description will come to represent the description for other DRAM addresses.

In FIG. 14, reference symbols are defined as follows; BANK is a bank address, TRAD is a row address, SGAD is a segment address, CHAD is a cache address, DT is a dirty bit, and VL is a valid bit. When the dirty bit DT in a cache memory is Low, it means that data matching is kept between the cache memory and the DRAM bank. When the dirty bit DT is High, it means that the data matching is lost. When the valid bit VL in a cache memory is High, it means that the cache memory is subjected to hit checks. When the valid bit VL is Low, the cache memory is not subjected to any hit check.

In step 1, four cache memories CH0 to CH3 are allocated to row address TRAD0 of bank address BK 0, and the cache memory CH0 retains data of the a bank address BK of 0, a row address TRAD[12] of 0, a row address TRAD[11:0] of 1, and a segment address SGAD of 1. The cache memory CH1 retains data of the a bank address BK of 0, a row address TRAD[12] of 0, a row address TRAD[11:0] of 10 and a segment address SGAD of 2.

The cache memory CH2 retains data of the a bank address BK of 0, a row address TRAD[12] of 0, a row address TRAD[11:0] of 11 and a segment address SGAD of 3. The cache memory CH3 retains data having a bank address BK of 0, a row address TRAD[12] of 0, a row address TRAD[11:0] of 20 and a segment address SGAD of 3.

Because the dirty bits DT and the valid bits VL of the cache memories CH0 to CH2 are High respectively, data matching is lost from between the data retained in the memory array having a bank address BK of 0 and a row address TRAD[12] of 1 and the data retained in the cache memories CH0 to CH2, which are subjected to hit checks.

Step 2 in FIG. 14 is address information in the case where hit checks are done against the cache memories CH0 to CH2 in response to a read request received in the state in step 1 and the cache memories are all missed and is "dirty".

Each address inputted from external is transformed by the address convert circuit AT so that the bank address BK becomes 0, the row addresses TRAD[12] and TRAD[11:0] become 0 and 35, and the segment address SGAD becomes 1. The transformed addresses are compared with those, having a High valid bit VL in the address comparison table. In this case, the address is mismatched. In addition, because the dirty bit DT in the cache memories CH0 to CH2 is High, it is a miss and is "dirty".

As a result, the data having a bank address BK of 0, a row address TRAD[12] of 0, a row address TRAD[11:0] of 35 and a segment address SGAD of 1 that are all requested is transferred to the cache memory CH3 having a Low valid bit VL by the address/command generation circuit ACG, then read therefrom. After that, the data retained in the cache memory CH0 is written back to a memory array area having a bank address BK of 0, a row address TRAD[12] of 0, a row address TRAD[11:0] of 1 and a segment address SGAD of 1.

At that time, in the address comparing information, 35 is retained in the row address TRAD[11:0] and 1 is retained in the segment address SGAD. And, the valid bit VL in the cache memory CH3 becomes High, thereby the cache memory CH3 is changed to a regular one to be subjected to hit checks.

On the other hand, the valid bit VL in the cache memory CH0 becomes Low, thereby the cache memory CH0 is changed to a spare one.

Step 3 in FIG. 14 is address comparing information in the case where it hits the cache memory CH3 in a hit check in response to a write request received in the state of step 2 shown in FIG. 14.

Each address inputted from external is transformed by the address convert circuit AT so that the bank address BK becomes 0, the row address TRAD[12] becomes 0, the row address TRAD[11:0] becomes 35 and the segment address SGAD becomes 1.

Each transformed address is compared with the address of the cache memories CH1 to CH3 for which the valid bit VL is set High in the address comparison table. In this case, the transformed address matches with the address of the cache memory CH3, thereby the CH3 is hit and the data is written in the cache memory CH3. At that time, the dirty bit DT in the address comparing information is changed from Low to High, which means that the cache memory CH3 has become "dirty".

Step 4 in FIG. 14 is address comparing information in the case where it misses the cache memory in a hit check performed in response to a read request received in the state of step 13 shown in FIG. 14.

Each address inputted from external is transformed by the address convert circuit AT so that the bank address BK becomes 0, the row address TRAD[12] becomes 0, the row address TRAD[11:0] becomes 55, and the segment address SGAD becomes 0.

Each transformed address is compared with an address having a High valid bit VL in the address comparison table. In this case, the addresses do not match and the hit check and the clean/dirty check for each of the cache memories CH1 to CH3 result in "miss" and is "dirty", since the dirty bit DT therein is High.

As a result, the data having a bank address BK of 0, a row address TRAD[12] of 0, a row address TRAD[11:0] of 55 and a segment address SGAD of 0 that are all specified is transferred to the cache memory CH1 for which the valid bit VL is set Low by the address/command generation circuit ACG, then read therefrom. After that, the data retained in the cache memory CH1 is written back to a memory array area having a bank address BK of 0, a row address TRAD[12] of 0, a row address TRAD[11:0] of 10 and a segment address SGAD of 2.

At that time, in the address comparing information, 55 is retained in the row address TRAD[11:0] and 0 is retained in the segment address SGAD, as well as the valid bit VL becomes High. The cache memory CH3 is thus changed to a regular one be subjected to hit checks. The valid bit VL in the cache memory CH1 becomes Low, thereby the CH1 is changed to a spare one.

As described above, processes in steps 1 to 4 are repeated according to the hit check results and the cache memories to become spare ones are changed one after another.

Second Embodiment

Figure 15:
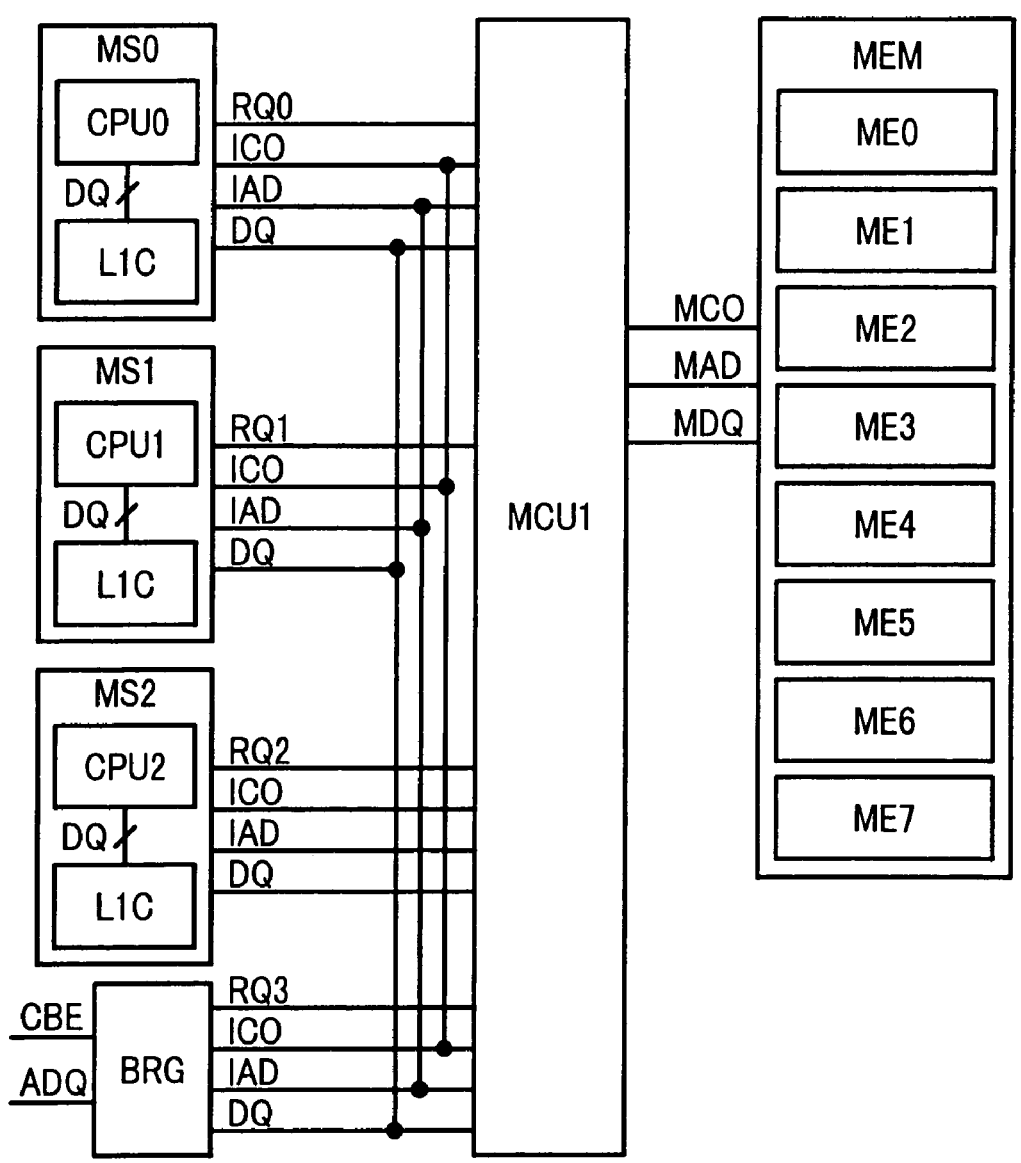
FIG. 15 is another block diagram of the information processing system of the present invention.

FIG. 15 shows another block diagram of the information processing system of the present invention.

This information processing system has a plurality of information processing units MS0, MS1, and MS2, each having a CPU and a primary cache memory L1C; a DRAM module MEM having a plurality of DRAMs, each having a plurality of built-in cache memories; a memory control unit MCU for controlling the DRAM module MEM; and a PCI bridge circuit BRG. The information processing system operates synchronously with a clock CLK.

The PCI bridge circuit BRG is provided with a PCI interface. The memory control unit MCU controls the DRAM module MEM in response to access requests received from the information processing units MS0 to MS2 and the PCI bridge circuit BRG.

The DRAM module MEM in this second embodiment shown in FIG. 15 is similar to the DRAM module shown in FIG. 1.

Although not limited specially, the CPU is capable of managing the address space with use of a 32-bit address signal and the DRAM module MEM is managed by the CPU.

The operation of the information processing system will now be described.

Read requests issued from the information processing units MS0, MS1, and MS2, as well as from the PCI bridge circuit BGR are inputted to the memory control unit MCU1 through access demand signals RQ0 to RQ3. The memory control unit MCU1 selects the request from the MS0 from among the received three read requests to enables only the selected request. Then, the MS0 outputs a read command and an address signal to the memory control unit MCU1 through the command signal ICO and the address signal IAD respectively. The memory control unit MCU, when receiving the read command and the address from the MS0, transfers the read command and the address to the DRAM module MEM through the memory command signal MC0 and the memory address MA0 respectively. The data requested from the MD0 of the DRAM module MEM is then transferred to the MS0 through data signal DQ.

Figure 16:
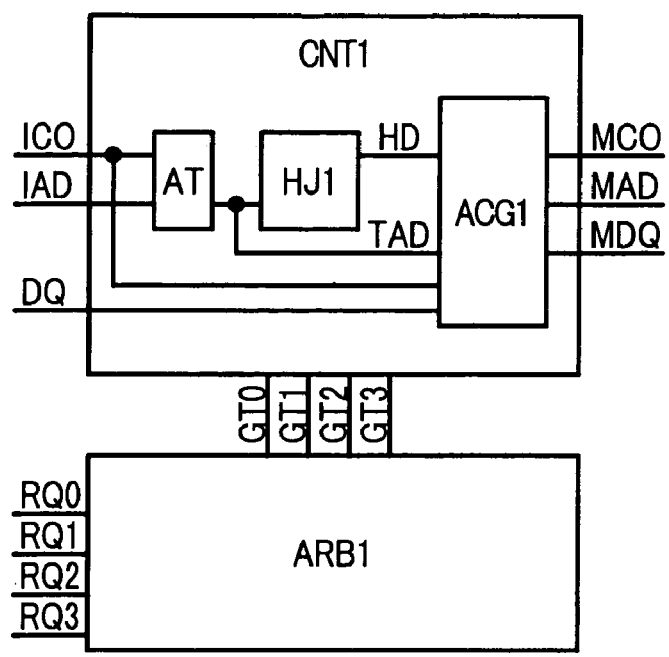
FIG. 16 is an embodiment of the present invention.

FIG. 16 shows a circuit diagram of a memory control unit MCU1 shown in FIG. 15.

The memory control unit MCU1 has an access arbitration circuit ARB1 for arbitrating among access requests to the DRAM module MEM and a memory control circuit CNT1.

The access arbitration circuit ARB1 receives access requests from each master of the MS0 to MS2, as well as the PCI bridge circuit BRG and enables one of the access enable signals GT0 to GT3 for the memory control circuit CNT1 according to the priority set by the access arbitration circuit ARB1 so as to allow the access.

The memory control circuit CNT1 has an address convert circuit AT, a hit check circuit HJ1, and an address/command generation circuit ACG.

The address convert circuit AT transforms the address of each allowed access destination into address information AD of a DRAM bank address, a row address, a column address, and a cache memory.

The hit check circuit HJ1 makes a hit/miss check if the address transformed by the address convert circuit AT hits any cache memory in the specified DRAM and a clean/dirty check if data matching is kept between the data retained in the hit DRAM cache memory (CH0 to CH15) and the data retained in the DRAM memory array ARY.

The address/command generation circuit ACG outputs a command signal for controlling the DRAM module MEM through the MC0 and a memory address signal through the MAD0 according to the result of the hit check by the hit check circuit HJ1 and transfers the requested data to the DRAM module MEM through the input/output signal MDQ.

Figure 17:
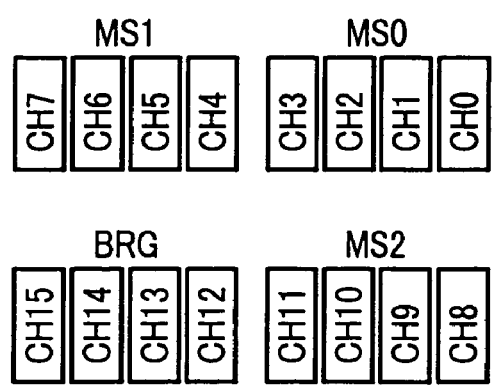
FIG. 17 is a chart for describing how built-in cache memories are allocated by a memory control unit MCU1.

FIG. 17 shows cache memories allocated by the memory control unit CNT1 to each master that accesses DRAM with built-in cache memories.

The four cache memories CH0 to CH3 are allocated for the information processing unit MS0 and those cache memories CH0 to CH3 retain data to be accessed from the information processing unit MS0.

The four cache memories CH4 to CH7 are allocated for the information processing unit MS1 and those cache memories CH4 to CH7 retain data to be accessed from the information processing unit MS1.

The four cache memories CH8 to CH11 are allocated for the information processing unit MS2 and those cache memories CH8 to CH11 retain data to be accessed from the information processing unit MS2.

The four cache memories CH12 to CH15 are allocated for the PCI bridge circuit BRG and those cache memories CH12 to CH15 retain data to be accessed from the PCI bridge circuit BRG.

The cache memories CH0 to CH3 are placed in the same hierarchical layer and no duplicated address is assigned to any memory bank. Same with the cache memories CH4 to CH7, CH8 to CH11, and CH12 to C15.

FIG. 18 shows an example of DRAM address information for each master, retained by the hit check circuit HJ1 to make hit checks.

In FIG. 18, reference symbols are defined as follows; BANK is a bank address, TRAD is a row address, SGAD is a segment address, CHAD is a cache address, DT means a dirty bit, and VL is a valid bit.

When the dirty bit DT in a cache memory is Low, it means data matching is kept between the cache memory and the DRAM memory array. When the dirty bit DT is High, it means that the data matching is lost.

When the valid bit VL in a cache memory is High, the cache memory is subjected to hit checks. When the VL is Low, it means that the cache memory is a spare one that is not subjected to any hit check.

The cache memories CH0 to CH3 are allocated for the master MS0.

The cache memory CH0 retains data having a bank address BANK of 0, a row address TRAD[12:0] of 1, and a segment address SGAD of 1.

The cache memory CH1 retains data having a bank address BANK of 1, a row address TRAD[12:0] of 10, and a segment address SGAD of 2.

The cache memory CH2 retains data having a bank address BANK of 0, a row address TRAD[12:0] of 11, and a segment address SGAD of 3.

The cache memory CH3 retains data having a bank address BANK of 1, a row address TRAD[12:0] of 20, and a segment address SGAD of 0.

The valid bit VL in each of the cache memories CH0 to CH2 is High, so that the cache memories CH0 to CH2 are subjected to hit checks while the valid bit VL in the cache memory CH3 is Low, so that the cache memory CH3 is not subjected to any hit check.

The dirty bit DT in each of the cache memories CH0 to CH2 is High, so that data matching is lost from between each of the cache memories CH0 to CH2 and the DRAM memory array. On the other hand, the dirty bit DT in the cache memory CH3 is Low, so that the data matching between the CH3 and the memory array is kept.

The four cache memories CH4 to CH7 are allocated for the master MS1.

The cache memory CH4 retains data having a bank address BANK of 1, a row address TRAD[12:0] of 33, and a segment address SGAD of 2.

The cache memory CH5 retains data having a bank address BANK of 0, a row address TRAD[12:0] of 45, and a segment address SGAD of 3.

The cache memory CH6 retains data having a bank address BANK of 0, a row address TRAD[12:0] of 32, and a segment address SGAD of 0.

The cache memory CH7 retains data having a bank address BANK of 1, a row address TRAD[12:0] of 27, and a segment address SGAD of 1.

The valid bit VL in each of the cache memories CH4 to CH6 is High, so that the cache memories CH4 to CH7 are subjected to hit checks while the valid bit VL in the cache memory CH7 is Low, so that the cache memory CH7 is not subjected to any hit check.

The dirty bit DT in each of the cache memories CH4 to CH7 is High, so that data matching between each of the cache memories CH4 to CH7 and the DRAM memory array is lost while the dirty bit DT in the cache memory CH7 is Low, so that data matching between the cache memory CH7 and the DRAM memory array is kept.

The four cache memories CH8 to CH11 are allocated for the master MS0.

The cache memory CH8 retains data having a bank address BANK of 0, a row address TRAD[12:0] of 16, and a segment address SGAD of 3.

The cache memory CH9 retains data having a bank address BANK of 0, a row address TRAD[12:0] of 3, and a segment address SGAD of 2.

The cache memory CH10 retains data having a bank address BANK of 1, a row address TRAD[12:0] of 47, and a segment address SGAD of 1.

The cache memory CH11 retains data having a bank address BANK of 1, a row address TRAD[12:0] of 55, and a segment address SGAD of 0.

The valid bit VL in each of the cache memories CH8 to CH10 is High, so that the cache memories CH8 to CH10 are subjected to hit checks while the valid bit VL in the cache memory CH11 is Low, so that the cache memory CH11 is not subjected to any hit check.

The dirty bit DT in each of the cache memories CH8 to CH10 is High, so that data matching between each of the cache memories CH8 to CH10 and the DRAM memory array is lost while the dirty bit DT in the cache memory CH11 is Low, so that data matching between the cache memory CH11 and the DRAM memory array is kept.

The four cache memories CH12 to CH15 are allocated for the master PCI bridge circuit BRG.

The cache memory CH12 retains data having a bank address BANK of 1, a row address TRAD[12:0] of 100, and a segment address SGAD of 3.

The cache memory CH13 retains data having a bank address BANK of 0, a row address TRAD[12:0] of 111, and a segment address SGAD of 2.

The cache memory CH14 retains data having a bank address BANK of 1, a row address TRAD[12:0] of 123, and a segment address SGAD of 2.

The cache memory CH15 retains data having a bank address BANK of 0, a row address TRAD[12:0] of 255, and a segment address SGAD of 0.

The valid bit VL in each of the cache memories CH12 to CH14 is High, so that the cache memories CH12 to CH14 are subjected to hit checks while the valid bit VL in the cache memory CH15 is Low, so that the cache memory CH15 is not subjected to any hit check.

The dirty bit DT in each of the cache memories CH12 to CH14 is High, so that data matching between each of the cache memories CH12 to CH14 and the DRAM memory array is lost while the dirty bit DT in the cache memory CH15 is Low, so that data matching between the cache memory CH15 and the DRAM memory array is kept.

Because regular cache memories and spare cache memories are allocated by each master such way, it is prevented that another master updates data in any cache memory, thereby cache memories are controlled optimally for each master.

Figure 19:
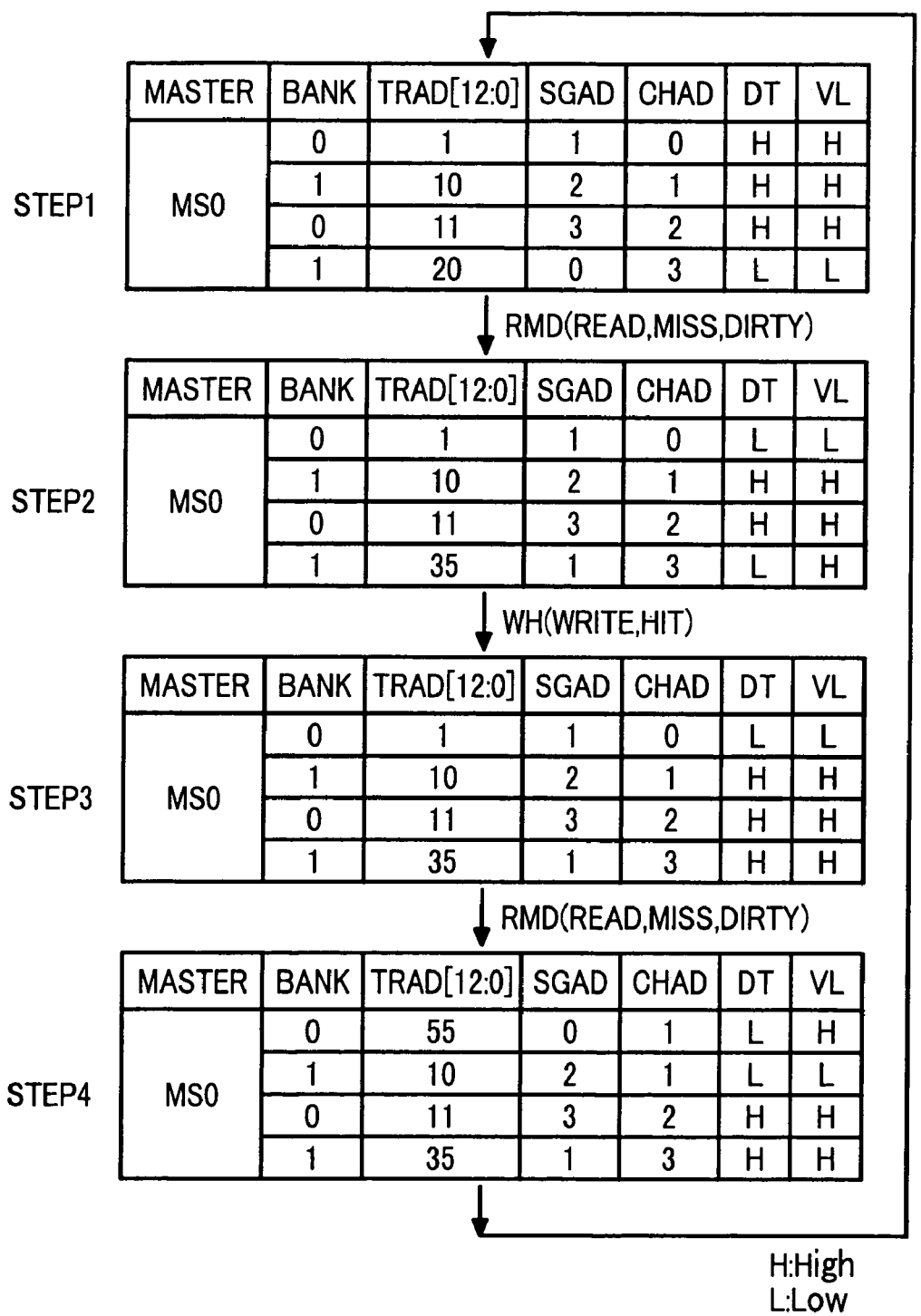
FIG. 19 is charts for describing the changes of DRAM address comparing information retained by the hit check circuit HJ1 to make hit checks.

FIG. 19 shows an example of how the DRAM address information changes in response to accesses. The address information is retained by the memory control unit MCU1 to make hit checks in response to accesses from the information processing unit MS0.

While the operation of the information processing unit MS0 is to be described here, that is similar to that of each of the information processing units MS1 and MS2, as well as the PCI bridge circuit BRG. The description for the operations of those MS1, MS2, and PCI bridge circuit BRG will thus be omitted here. In FIG. 19, reference symbols are defined as follows; BANK is a bank address, TRAD is a row address, SGAD is a segment address, CHAD is a cache address, DT is a dirty bit, and VL is a valid bit. When the dirty bit DT in a cache memory is Low, it means that data matching between the cache memory and the DRAM bank is kept. When the dirty bit DT is High, it means that the data matching between them is lost. When the valid bit VL in a cache memory is High, it means that the cache memory is subjected to hit checks. When the valid bit VL is Low, it means that the cache memory is not subjected to such hit check.

In step 1 shown in FIG. 19, the four cache memories CH0 to CH3 are allocated for the information processing unit MS0 and the cache memory CH0 retains data having a bank address BANK of 0, a row address TRAD[12:0] of 1, and a segment address SGAD of 1. The cache memory CH1 retains data having a bank address BANK of 1, a row address TRAD[12:0] of 10, and a segment address SGAD of 2. The cache memory CH2 retains data having a bank address BANK of 0, a row address TRAD[12:0] of 11, and a segment address SGAD of 3. The cache memory CH3 retains data having a bank address BANK of 0, a row address TRAD[12:0] of 20, and a segment address SGAD of 3.

Both of the dirty bit DT and the valid bit VL are High in each of the cache memories CH0 to CH3, data matching between the data in the memory array area and each of the cache memories CH0 to CH3 is kept and the cache memories CH0 to CH3 are subjected to hit checks.

Step 2 shown in FIG. 19 means address information in the case where each of the cache memories CH0 to CH3 is missed and decided as "dirty" in the hit check and the clean/dirty check respectively. The checks are done in response to a read request received from the information processing unit MS0.

Each address inputted from external is transformed so that the bank address BK becomes 0, the row address [12:0] becomes 35, and the segment address SGAD becomes 1. Each transformed address is compared with the address having a High valid bit VL in the address comparison table. In this case, the addresses do not match and the dirty bit DT in each of the cache memories CH0 to CH2 is High, thereby the checks result in "miss" and "dirty".

Consequently, the data having a bank address BANK of 0, a row address TRAD[12:0] of 35, and a segment address SGAD of 1 is transferred by the address/command generation circuit ACG to the cache memory CH3 for which the valid bit VL is set Low, then read therefrom. After that, the data retained in the cache memory CH0 is written back to a memory array area in which the bank address BANK is 0, the row address TRAD[12:0] is 0, and the segment address SGAD is 1.

At that time, in the address comparing information, 35 is retained in the row address TRAD[12:0] of the cache memory CH3 and 1 is retained in the segment address SGAD while the valid bit VL becomes High and the cache memory CH3 is changed to a regular cache memory to be subjected to hit checks.

The valid bit VL in the cache memory CH0 becomes Low and the cache memory CH0 is changed to a spare one.

Step 3 shown in FIG. 19 is address comparing information in the case where the cache memory CH3 is hit in response to a write request received from the information processing unit MS0 in the state of step 2.

Each address inputted from external is transformed by the address convert circuit AT so that the bank address BK becomes 0, the row address [12:0] becomes 35, and the segment address SGAD becomes 1.

The transformed address is compared with each of the addresses of the cache memories CH1 to CH3 having a High valid bit VL respectively in the address comparison table. As a result, the address matches with that of the CH3, so that the data retained in the address is written in the cache memory CH3. At that time, the dirty bit DT in the address comparing information is changed from Low to High. It means that the clean/dirty check has resulted in "dirty".

Step 4 shown in FIG. 19 is address comparing information in the case where cache memories are missed in hit checks performed in response to a read request received from the information processing unit MS0 in the state of step 3.

In this connection, each address inputted from external is transformed by the address convert circuit AT so that the bank address BK becomes 0, the row address [12:0] becomes 55, and the segment address SGAD becomes 0.

Each transformed address is compared with each of the addresses of the cache memories CH1 to CH3 having a High valid bit VL respectively in the address comparison table. In this case, the addresses do not match and the dirty bit DT in each of the cache memories CH1 to CH3 becomes High, thereby the hit check results in "miss" and the clean/dirty check results in "dirty".

Consequently, the data having a bank address BK of 0, a row address TRAD[12:0] of 0, a row address [11:0] of 55, and a segment address SGAD of 0 is transferred by the address/command generation circuit ACG to the cache memory CH1 having a Low valid bit VL, then read therefrom. After that, the data retained in the cache memory CH1 is written back to a memory array area having a bank address BK of 0, a row address TRAD[12:0] of 10, and a segment address SGAD of 2.

At that time, in the address comparing information, 55 is retained in the row address TRAD[12:0] of the cache memory CH3 and 0 is retained in the segment address SGAD while the valid bit VL becomes High and the cache memory CH3 is changed to a regular cache memory to be subjected to hit checks.

On the other hand, the valid bit VL in the cache memory CH1 becomes Low and the cache memory CH1 is changed to a spare one.

As described above, the processes in steps 1 to 4 are repeated by the memory control unit CNT1 as described above to change the cache memories to spare ones and the DRAM module that uses such spare cache memories is controlled faster similarly to the examples shown in FIGS. 11 through 13.

Furthermore, because cache memories including spare ones are allocated by each master as described above, other masters cannot update data in any cache memory. And, this makes it possible to control the cache memories optimally for each master.

Third Embodiment

Figure 20:
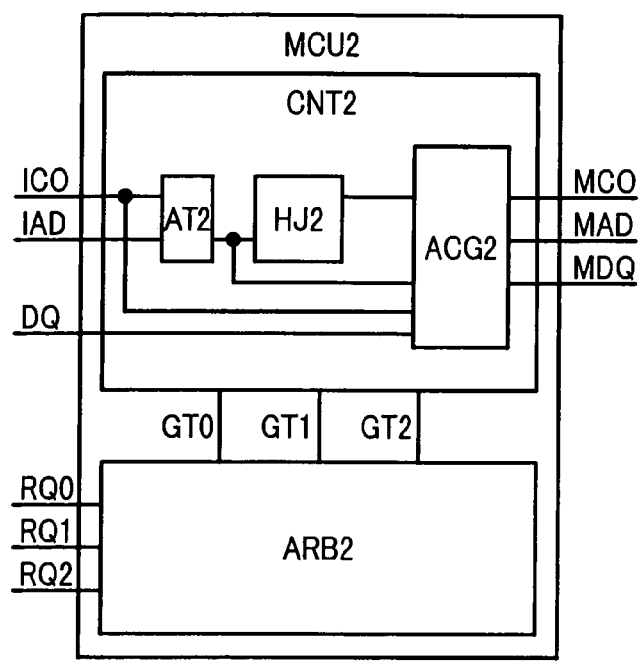
FIG. 20 is an embodiment of the present invention.

FIG. 20 shows a block diagram of a memory control circuit MCU2 of the present invention.

This circuit has an access arbitration circuit ARB2 for arbitrating among access requests to the DRAM module MEM and a memory control circuit CNT2.

The memory control circuit CNT2 receives access requests RQ0 to RQ2 and enables each of the requests according to the priority set by the arbitration circuit ARB2.

The memory control circuit CNT2 has an address convert circuit AT2, a hit check circuit HJ2, and an address/command generation circuit ACG2.

The address convert circuit AT2 transforms each access-enabled address into address information AD of a bank, a row, a segment, a column, and a cache memory of a target DRAM.

The hit check circuit HJ2 makes hit/miss checks if an address transformed by the address convert circuit AT2 hits any cache memory/sense amplifier in the target DRAM and clean/dirty checks if data matching is kept between the hit DRAM cache memory (CH0 to CH15) and the DRAM memory cell array ARY.

The address/command generation circuit ACG2 outputs a memory command signal for controlling the DRAM module MEM through the MC0 and a memory address signal through the MAD0 according to the result of each check by the hit check circuit HJ2 to transfer requested data through the input/output signal MDQ.

Because sense amplifiers are also used as cache memories in addition to the built-in ones as described above, the total size of the cache memories increases by the data size retained in the sense amplifiers, thereby the hit rate of the cache memories is improved enough to operate the DRAM module MEM faster and at lower power consumption.

Figure 21:
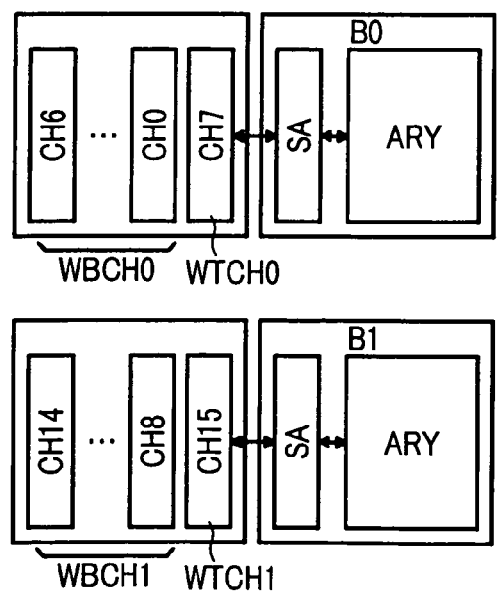
FIG. 21 is charts for describing how built-in cache memories are allocated by a memory control unit MCU2.

FIG. 21 shows an example of cache memories allocated by the memory control circuit CNT2 for both bank 0 (B0) and bank 1 (B1).

The eight cache memories CH0 to CH7 are allocated for the bank 0 (B0).

A cache memory group WBCH0 consisting of cache memories CH0 to CH6 becomes "dirty" in the case where data matching with the memory cell array ARY is lost.

On the other hand, the cache memory CH7 (WTCH0) can always keep data matching with the memory cell array ARY. In other words, if data is written in the cache memory CH7, the same data is always written in the memory cell array ARY, as well.

The eight cache memories CH8 to CH15 are allocated for the bank 1 (B1).

A cache memory group WBCH1 consisting of cache memories CH8 to CH14 becomes "dirty" in the case where data matching with the memory cell array ARY is lost.

On the other hand, the cache memory CH15 (WTCH1) can always keep data matching with the memory cell array ARY. In other words, if data is written in the cache memory CH15, the same data is always written in the memory cell array ARY, as well.

Because cache memories are allocated for each DRAM bank as described above, part of the date retained in the bank 0 (B0) can also be retained in the cache memories CH0 to CH7 while part of the data retained in the bank 1 (B1) can also be retained in the cache memories CH8 to CH15.

FIG. 22A shows an example of tag addresses retained by the hit check circuit HJ2 to make hit/miss checks for the cache memories CH0 to CH15.

In FIG. 22, reference symbols are defined as follows; BANK is a bank address, TRAD[12:0] is a row address, SGAD is a segment address, CHAD is a cache memory address, DT is a dirty bit, VL is a valid bit, and WTH is a write-through bit.

When the dirty bit in a cache memory is Low, it is that the cache memory keeps data matching with the DRAM array. When the dirty bit is High, it means the data matching is lost.

Because the dirty bit DT is High in each of the cache memory addresses CHAD 0 to 14, the data matching between each of the cache memories CH0 to CH14 and the DRAM array is lost.

When the dirty bit DT in each of the cache memory addresses CHAD 7 and 15 is Low, it means that data matching between each of the cache memories CH7 and CH15 and the DRAM array is kept.

When the valid bit VL in a cache memory is High, it means that the cache memory is subjected to hit checks. When the valid bit VL is Low, it means that the cache memory is not subjected to any hit check. In this case, all the cache memories are subjected to hit checks.

When the write-through bit WTH in a cache memory is High, it means that if data is written in the cache memory, the same data is always written in the memory cell array ARY (write-through). When the WTH is Low in a cache memory, it means that data in the cache memory is written back to the memory cell array ARY as needed (write-back).

Because the write-through bit WTH in each of the cache memory addresses CHAD 7 and 15 is High, the cache memories CH7 and CH15 are subjected to write-through operations.

Because the write-through bit WTH in each of the cache memory addresses CHAD 0 to 6 and 8 to 14 is Low, the cache memories CH0 to CH6 and CH8 to CH14 are subjected to write-back operations.

Because the value 0 of the cache memory address CHAD corresponds to the cache memory CH0, the cache memory CH0 retains data having a bank address of 0, a row address TRAD[12:0] of 0, and a segment address of 2.

Because the value 1 of the cache memory address CHAD corresponds to the cache memory CH1, the cache memory CH1 retains data having a bank address of 0, a row address TRAD[12:0] of 3, and a segment address of 3.

Because the value 2 of the cache memory address CHAD corresponds to the cache memory CH2, the cache memory CH2 retains data having a bank address of 0, a row address TRAD[12:0] of 11, and a segment address of 3.

Because the value 3 of the cache memory address CHAD corresponds to the cache memory CH3, the cache memory CH3 retains data having a bank address of 0, a row address TRAD[12:0] of 20, and a segment address of 0. [102]

Because the value 4 of the cache memory address CHAD corresponds to the cache memory CH4, the cache memory CH4 retains data having a bank address of 0, a row address TRAD[12:0] of 33, and a segment address of 2.

Because the value 5 of the cache memory address CHAD corresponds to the cache memory CH5, the cache memory CH5 retains data having a bank address of 0, a row address TRAD[12:0] of 45, and a segment address of 3.

Because the value 6 of the cache memory address CHAD corresponds to the cache memory CH6, the cache memory CH6 retains data having a bank address of 0, a row address TRAD[12:0] of 32, and a segment address of 0.

Because the value 7 of the cache memory address CHAD corresponds to the cache memory CH7, the cache memory CH7 retains data having a bank address of 0, a row address TRAD[12:0] of 27, and a segment address of 1.

Because the value 8 of the cache memory address CHAD corresponds to the cache memory CH8, the cache memory CH8 retains data having a bank address of 1, a row address TRAD[12:0] of 16, and a segment address of 3.

Because the value 9 of the cache memory address CHAD corresponds to the cache memory CH9, the cache memory CH9 retains data having a bank address of 1, a row address TRAD[12:0] of 3, and a segment address of 2.

Because the value 10 of the cache memory address CHAD corresponds to the cache memory CH10, the cache memory CH10 retains data having a bank address of 1, a row address TRAD[12:0] of 47, and a segment address of 1.

Because the value 11 of the cache memory address CHAD corresponds to the cache memory CH11, the cache memory CH11 retains data having a bank address of 1, a row address TRAD[12:0] of 55, and a segment address of 0.

Because the value 12 of the cache memory address CHAD corresponds to the cache memory CH12, the cache memory CH12 retains data having a bank address of 1, a row address TRAD[12:0] of 100, and a segment address of 3.

Because the value 13 of the cache memory address CHAD corresponds to the cache memory CH13, the cache memory CH13 retains data having a bank address of 1, a row address TRAD[12:0] of 111, and a segment address of 2.

Because the value 14 of the cache memory address CHAD corresponds to the cache memory CH14, the cache memory CH14 retains data having a bank address of 1, a row address TRAD[12:0] of 123, and a segment address of 2.

Because the value 15 of the cache memory address CHAD corresponds to the cache memory CH15, the cache memory CH15 retains data having a bank address of 1, a row address TRAD[12:0] of 255, and a segment address of 0.

FIG. 22B shows DRAM addresses retained by the hit check circuit HJ2 to make hit checks for sense amplifiers.

In FIG. 22B, reference symbols are defined as follows; BANK is a bank address, TRAD[12:0] is a row address, and SVL is a sense amplifier valid bit. When the sense amplifier valid bit SVL in a sense amplifier is High, it is that the sense amplifier is inactive.

A sense amplifier having a bank address of 0 is activated, so that the sense amplifier retains data having a row address TRAD[12:0] of 27 while the sense amplifier having a bank address of 1 is activated, so that the sense amplifier retains data having a row address TRAD[12:0] of 255.

Because sense amplifiers are also used as cache memories in addition to the built-in cache memories, the total size of the cache memories increases by 16 K bits (8K bits×2 banks), thereby the hit rate of the cache memories is improved enough to operate the DRAM module MEM faster and at lower power consumption.

FIG. 23 shows an example of hit checks performed by the memory control circuit MCU2 for both built-in cache memories and sense amplifiers.

Figure 23A:
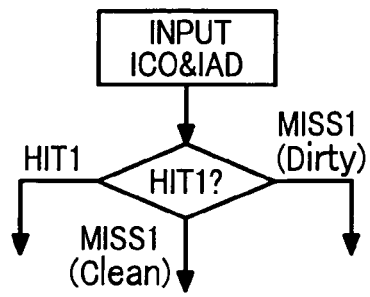
FIG. 23 is a hit check operation performed by the hit check circuit HJ2.

FIG. 23A shows a hit check operation for a cache memory in which the write-through bit WTH shown in FIG. 22A is set Low.

If a command IC0M and an address IAD are inputted to the memory control unit MCU2, the hit check circuit HJ2 in the memory control unit MCU2 makes hit checks concurrently for all the cache memories in which the write-through bit WTH is set Low respectively.

If the inputted address IAD matches with an address having a Low write-through bit WTH in the tag address retained in the hit check circuit HJ2, the hit check result becomes HIT1. If the addresses do not match and the dirty bit DT is High in the address comparison table of the compared cache memory, the hit check and the clean/dirty check result in MISS1 (dirty). If the addresses do not match and the dirty bit DT in the tag address of the compared cache memory is Low, the hit check and the dirty/clean check result in MISS1 (clean).

Figure 23B:
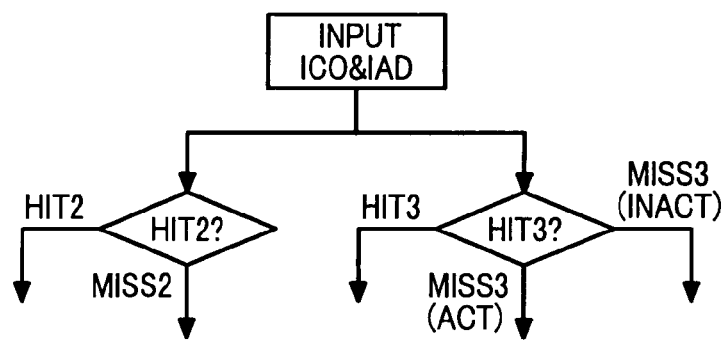

FIG. 23B shows a hit check operation performed for each of cache memories and sense amplifiers shown in FIG. 22B having a High write-through bit WTH shown in FIG. 23A respectively.

If a command ICOM and an address IAD are inputted to the memory control unit MCU2, the hit check circuit HJ2 in the memory control unit MCU2 makes hit checks for all the cache memories and the sense amplifiers having a High write-through bit WTH respectively at the same time.

If the inputted address IAD matches with an address having a High write-through bit WTH shown in FIG. 22A and set in the tag address retained in the hit check circuit HJ2, the hit check results in HIT2. If the addresses do not match, the hit check results in MISS2. If the inputted address IAD matches with an address in the tag address shown in FIG. 23B and the sense amplifier valid bit SVL is High, the hit check results in HIT3. If the addresses do not match and the sense amplifier valid bit SVL in the tag address of the compared sense amplifier is High, the hit check results in MISS3 (ACT). When the sense amplifier valid bit SVL is Low, the hit check results in MISS3 (INACT).

Figure 23C:
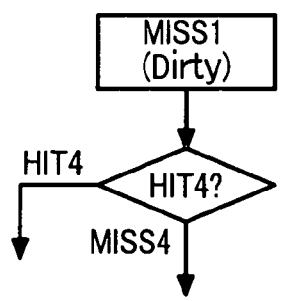

FIG. 23C shows a hit check operation performed between the tag address of each of the sense amplifiers shown in FIG. 22B and each of the bank address BANK and the row address TRAD[12:0] of each cache memory resulted in MISS1 (dirty) when the hit check results in MISS1 (dirty) in each cache memory having a High write-through bit WTH shown in FIG. 22A.

If the bank address BANK and the row address TRAD [12:0] in the tag address of the cache memory decided as MISS1 (dirty) matches with the bank address BANK1 and the row address TRAD[12:0] in the tag address of the sense amplifier shown in FIG. 22B, the hit check results in HIT4. If they do not match, the hit check results in MISS4.

FIG. 24 shows a sequence of data write commands output to the memory module MEM0 from the address/command generation circuit ACG according to the hit check result described with reference to FIG. 23.

If the hit check result is HIT1, the address/command generation circuit ACG2 outputs a write command WT to the MEM0 regardless of other check results. At that time, the write destination DEST is the hit write-back cache memory WBCH and the DRAM write latency WLAT becomes 0 and the write power WPW become 0.25.

If the check results are MISS1, HIT2, and ACT, the address/command generation circuit ACG2 outputs a write command WT and a restore command RT to the MEM0 to write data in the write-through cache memory and the memory cell array ARY regardless of other check results. At that time, the write destination DEST is the hit write-through cache memory WTCH and the memory cell array ARY and the DRAM write latency WLAT becomes 0 and the write power WPW becomes 0.35.

If the check results are MISS1, MISS2, HIT3, and ACT, the address/command generation circuit ACG2 outputs a precharge command PRE and a ban active command AC, a prefetch command PF, and a write command WT to the MEM0 to write data in the write-back cache memory. At that time, the write-back cache memory WBCH becomes a write destination DEST and the DRAM write latency WLAT becomes 6 and the write power WPW becomes 1.0.

If the check results are MISS1 (clean), MISS2, MISS3, and ACT, the address/command generation circuit ACG2 outputs a bank active command AC, a prefetch command PF, and a write command WT to the MEM0 to write data in the write-back cache memory regardless of other check results. At that time, the write-back cache memory WBCH becomes a write destination DEST and the DRAM write latency WLAT becomes 4 and the write power WPW becomes 0.9.

If the check results are MISS1 (dirty), MISS2, MISS3, ACT, and HIT4, the address/command generation circuit ACG2 outputs a restore command RT, a precharge command PRE, a bank active command AC, a prefetch command PF, and a write command WT to the MEM0 to write back data to the memory cell array ARY and to the write-back cache memory respectively. At that time, the write-back cache memory WBCH and the memory cell array ARY become write destinations DEST and the DRAM write latency WLAT becomes 8 and the write power WPW becomes 1.2.

If the check results are MISS1 (dirty), MISS2, MISS3, ACT, and HIT4, the address/command generation circuit ACG2 outputs a precharge command PRE, a restore command RT, a bank active command AC, a precharge command PRE, another bank active command AC, a prefetch command PF, and a write command WT to the MEM0 to write back data to the memory cell array ARY and to the write-back cache memory respectively. At that time, the write-back cache memory WBCH and the memory cell array ARY become write destinations DEST and the DRAM write latency WLAT becomes 12 and the write power WPW becomes 1.8.

If the check results are MISS1 (dirty), MISS2, MISS3, INACT, and MISS4, the address/command generation circuit ACG2 outputs a restore command RT, a bank active command AC, a precharge command PRE, another bank active command AC, a prefetch command PF, and a write command WT to the MEM0 to write back data to the memory cell array ARY and write data in the write-back cache memory respectively. At that time, the write-back cache memory WBCH and the memory cell array ARY become write destinations DEST and the DRAM write latency WLAT becomes 10 and the write power WPW becomes 1.7.

FIG. 25 shows a sequence of commands for writing data, which are issued by the address/command generation circuit ACG to the memory module MEM0 according to the result of each hit check described with reference to FIG. 23.

If the check result is HIT1, the address/command generation circuit ACG2 outputs a read command RD to the MEM0 to read data from the write-back cache memory WBCH regardless of other check results. At that time, the hit write-back cache memory WBCH becomes a read source SORS and the DRAM read latency RLAT becomes 2 and the read power RPW becomes 0.25.

If the check results are MISS1, HIT2, and ACT, the address/command generation circuit ACG2 outputs a read command RD to the MEM0 to read data from the write-through cache memory WTCH regardless of other check results. At that time, the hit write-through cache memory WTCH becomes a read source SORS and the DRAM read latency RLAT becomes 2 and the read power RPW becomes 0.25.

If the check results are MISS1, MISS2, HIT3, and ACT, the address/command generation circuit ACG2 outputs a prefetch command PRE and a read command RD to the MEM0 to read data from the write-through cache memory WTCH regardless of other check results. At that time, the hit write-through cache memory WTCH becomes a read source SORS and the DRAM read latency RLAT becomes 2 and the read power RPW becomes 0.5.

If the check results are MISS1 (clean), MISS2, MISS3, and ACT, the address/command generation circuit ACG2 outputs a precharge command PRE, a bank active command AC, a prefetch command PF, and a read command RD to the MEM0 to read data from the write-back cache memory WBCH regardless of other check results. At that time, the hit write-back cache memory WBCH becomes a read source SORS and the DRAM read latency RLAT becomes 8 and the read power RPW becomes 1.0.

If the check results are MISS1 (clean), MISS2, MISS3, and INACT, the address/command generation circuit ACG2 outputs a bank active command AC, a prefetch command PF, and a read command RD to the MEM0 to read data from the write-back cache memory WBCH regardless of other check results. At that time, the hit write-back cache memory WBCH becomes a read source SORS and the DRAM read latency RLAT becomes 6 and the read power RPW becomes 0.9.

If the check results are MISS1 (dirty), MISS2, MISS3, and ACT, the address/command generation circuit ACG2 outputs a restore command RT, a precharge command PRE, a bank active command AC, a prefetch command PF, and a read command RD to the MEM0 to write back data to the memory cell array ARY and read data from the write-back cache memory WBCH regardless of other check results. At that time, the hit write-back cache memory WBCH becomes a read source SORS and the DRAM read latency RLAT becomes 10 and the read power RPW becomes 1.2.

If the check results are MISS1 (dirty), MISS2, MISS3, ACT, and MISS4, the address/command generation circuit ACG2 outputs a precharge command PRE, a restore command RT, a bank active command AC, a precharge command PRE, another bank active command AC, a prefetch command PF, and a read command RD to the MEM0 to write back data to the memory cell array ARY and read data from the write-back cache memory WBCH regardless of other check results. At that time, the hit write-back cache memory WBCH becomes a read source SORS and the DRAM read latency RLAT becomes 14 and the read power RPW becomes 1.8.

If the check results are MISS1 (dirty), MISS2, MISS3, INACT, and MISS4, the address/command generation circuit ACG2 outputs a restore command RT, a bank active command AC, a precharge command PRE, another bank active command AC, a prefetch command PF, and a read command RD to the MEM0 to write back data to the memory cell array ARY and read data from the write-back cache memory WBCH regardless of other check results. At that time, the write-back cache memory WBCH becomes a read source SORS and the DRAM read latency RLAT becomes 12 and the read power RPW becomes 1.7.

As described above, because sense amplifiers are also used as cache memories in addition to the built-in ones, the total size of those cache memories comes to increase by 16 K bits (8 K bits×2 banks), thereby the hit rate of the cache memories is improved enough to operate the DRAM module MEM faster and at lower power consumption.

Fourth Embodiment

Figure 26:
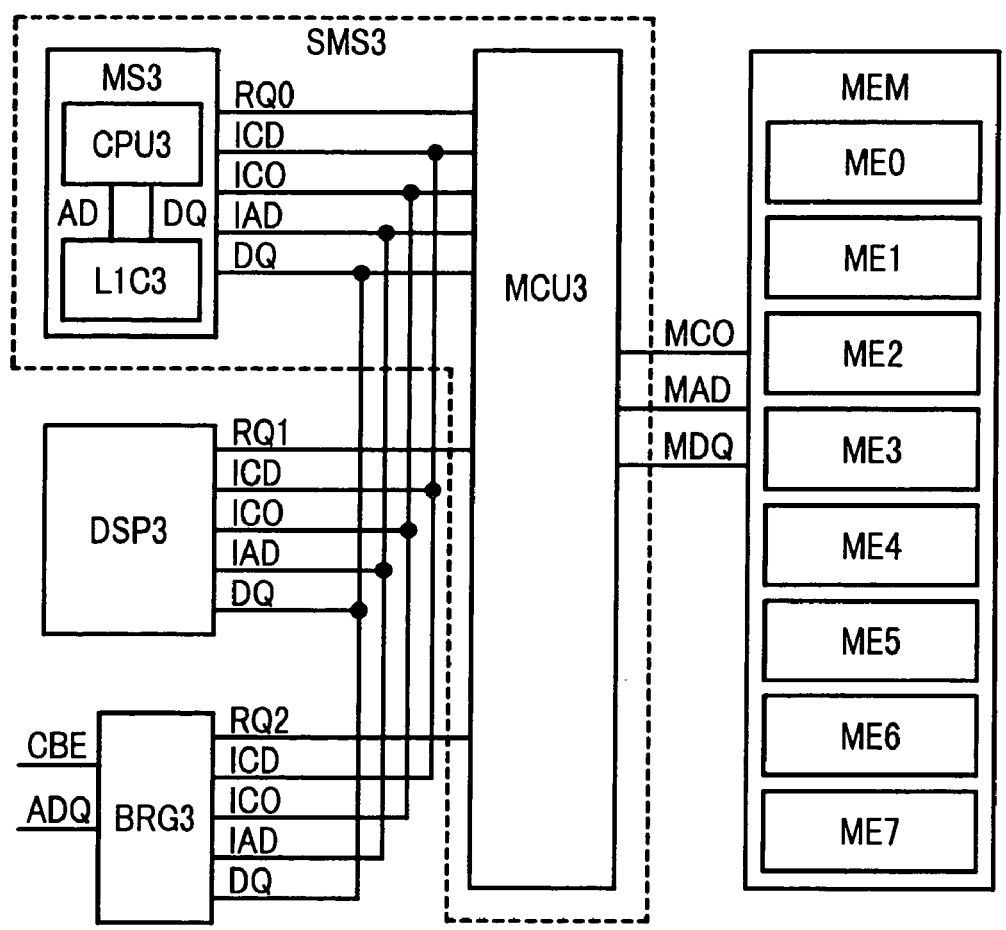
FIG. 26 is still another information processing system of the present invention.

FIG. 26 is still another information processing system of the present invention.

This information processing system SMS3 has an information processing unit MS3 consisting of a central processing unit CPU and a primary cache memory L1C3; a DRAM module MEM consisting of a plurality of DRAMs, each including a plurality of built-in caches; a memory control unit MCU3 for controlling the DRAM module MEM; and a digital signal processor DSP3; and a PCI bridge circuit BRG3. This information processing system SMS3 operates synchronously with a clock CLK. Although not limited specially, the information processing unit MS3 and the memory control unit MCU3 may be formed on the same substrate to realize the information processing system SMS3.

The PCI bridge circuit BRG3 is provided with a PCI interface and the memory control unit MCU3 receives access requests from the information processing unit MS3, the digital signal processor DSP3, and the PCI bridge circuit BRG3 to control the DRAM module MEM.

The DRAM module MEM has eight memories (the zero-th memory M0 to the seventh memory M7). Each of the eight memories has 16 cache memories and two memory banks, although it is not limited so specially. Each memory bank is an SDRAM provided with a sense amplifier.

The information processing system SMS3, although not limited so specially, can manage the address space with use of a 32-bit address signal while the DRAM module MEM is managed by the information processing system SMS3.

Hereunder, the operation of the information processing system SMS3 will be described.

At first, read requests issued from the MS3, the DSP3, and the BRG3 are inputted to the memory control unit MCU through RQ0 to RQ2 signals. The memory control unit MCU then selects the request issued from the MS3 from among the three requests to enable the request. Then, the MS3 outputs a read command and an address to the memory control unit MCU3 through the command signal ICO and the address signal IAD, as well as the attribute of the data requested by the data attribute signal ICD to the memory control unit MCU3. The memory control unit MCU3 receives the read command and the address issued from the MS3, then transfers the read command and the address to the DRAM module MEM through the memory command signal MCO and the memory address signal MA0 respectively. Thus, the requested data is output from the MDQ signal of the DRAM module MEM to be transferred to the MS3 through the DQ signal.

Figure 27:
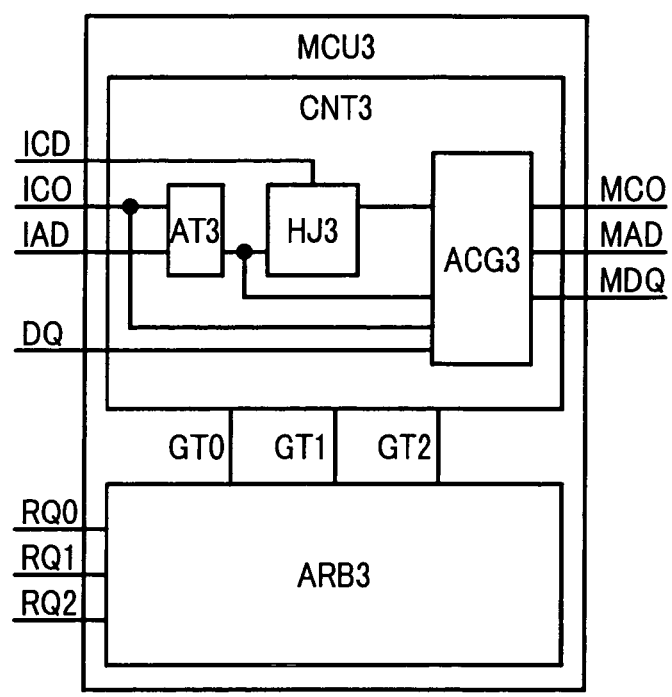
FIG. 27 shows an embodiment of the present invention.

FIG. 27 shows a block diagram of the memory control unit MCU3 of the present invention.

This circuit has an access arbitration circuit ARB3 for arbitrating among access requests to the DRAM module MEM, a memory control circuit CNT3, etc.

The arbitration circuit ARB3 receives access requests RQ0 to RQ2 and enables each of the requests sequentially according to the priority set by the arbitration circuit ARB3.

The memory control circuit CNT3 has an address convert circuit AT3, a hit check circuit HJ3, and an address/command generation circuit ACG3.

The address convert circuit AT3 transforms each access-enabled address IAD to the address information AD of a DRAM bank, a row, a segment, and a cache memory.

The ICD signal is used to input information for denoting whether the requested data type is a command or processed data.

The hit check circuit HJ3 receives the information through the ICD signal and an address transformed by the address convert circuit AT3 to make hit/miss checks for the cache memories in each DRAM, as well as for each sense amplifier, as well as a clean/dirty check for checking whether or not the data matching between each hit DRAM built-in cache memory (CH0 to CH15) and the DRAM memory cell array ARY is kept.

The address/command generation circuit ACG3 outputs a memory command signal for controlling the DRAM module MEM according to the result of each check by the hit check circuit HJ3 through the MC0 signal and a memory address signal through the MAD0 signal and transfers requested data through the input/output signal MDQ.

Figure 28:
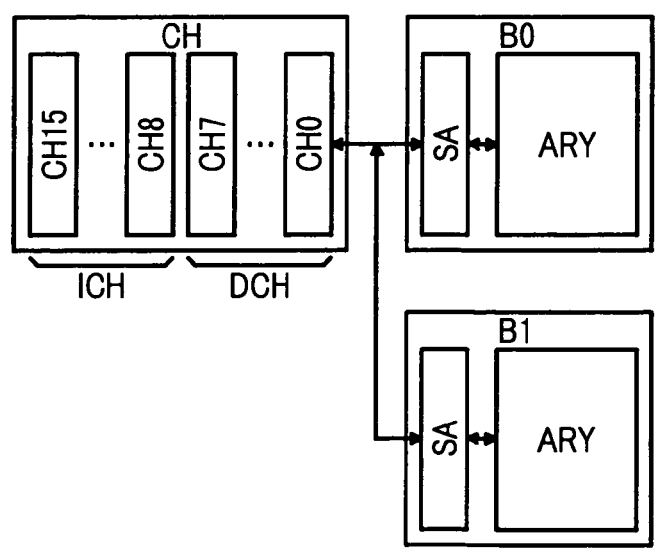
FIG. 28 shows a chart for describing how cache memories are allocated by a memory control unit MCU3.

FIG. 28 shows cache memories built in a DRAM, which are allocated by the memory control circuit CNT3. Although not limited specially, in a cache memory group consisting of cache memories CH8 to CH15, a data attribute is assigned to each command. In a cache memory group consisting of the cache memories CH0 to CH7, a data attribute is assigned to each processed data. In addition, one of the cache memory groups functions as a spare cache memory as shown in FIG. 14.

If a data attribute is a command, only read requests are issued to the DRAM module MEM, so that the data retained in each cache memory having a data attribute set for a command is not required to be written back to the DRAM array. The cache memory can thus be accessed faster.

If the data attribute is processed data, both read and write requests are issued to the DRAM module MEM. Thus, data retained in a cache memory DCH having a data attribute set for processed data must be written back to the DRAM array. This is why such a cache memory DCH is provided with a spare cache memory, so that the latency, when a miss is detected in the DRAM module, is suppressed at 6T by means of the operation shown in FIGS. 11 and 12 so as to access the cache memory DCH faster.

Because a cache memory built in each DRAM is allocated for a data attribute (command/data), the data in such a cache memory is never replaced with another even at a change of the data attribute. As a result, each cache memory is controlled optimally to each data attribute.

Figure 29:
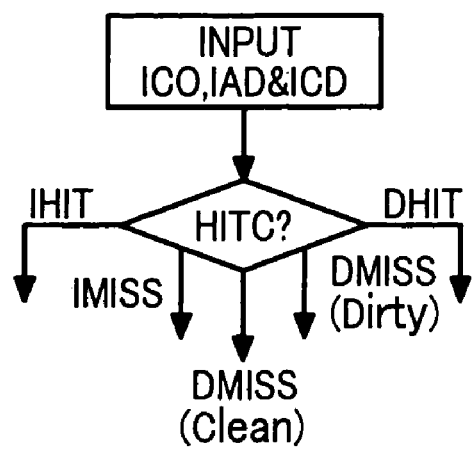
FIG. 29 is a hit check operation performed by the hit check circuit HJ3.

FIG. 29 shows a hit check performed by the memory control unit MCU3 for a built-in cache memory.

If a command ICOM, an address IAD, and a data attribute ICD are inputted to the memory control unit MCU3, the hit check circuit HJ3 in the memory control unit MCU3, when the data attribute is command, makes hit checks for the cache memory group ICH (CH8 to CH15). If the data attribute is processed data, the memory control unit MCU3 makes hit checks for the cache memory group (CH0 to CH7). If the cache memory group is hit, the memory control unit MCU3 output IHIT to the address/command generation circuit ACG. If the group is missed, the memory control unit MCU3 outputs IMISS to the address/command generation circuit ACG. If the cache memory group DCH is hit, the memory control unit MCU3 outputs DHIT to the address/command generation circuit ACG. If the group is missed and the clean/dirty check results in clean, the memory control unit MCU3 outputs DMISS (clean) to the address/command generation circuit ACG. If the group is missed and the clean/dirty check results in dirty, the memory control unit MCU3 outputs DMISS (dirty) to the address/command generation circuit ACG.

FIG. 30A shows a sequence of commands for reading data, which are output by the address/command generation circuit ACG to the DRAM module MEM0 according to the result of each hit check described with reference to FIG. 29.

If the check result is IHIT, the address/command generation circuit ACG3 outputs a read command RD to the MEM0. At that time, the read source SORS is the hit command cache memory ICH and the DRAM read latency RLAT become 2 and the read power RPW becomes 0.25.

If the check result is IMISS, the address/command generation circuit ACG3 outputs a bank active command AC, a prefetch command RF, a read command RD, and a precharge command PRE to the MEM0. At that time, the read source SORS is the hit command cache memory ICH and the DRAM read latency RLAT become 6 and the read power RPW becomes 1.0.

If the check result is DHIT, the address/command generation circuit ACG3 outputs a read command RD to the MEM0. At that time, the read source SORS is the hit data cache memory DCH and the DRAM read latency RLAT become 2 and the read power RPW becomes 0.25.

If the check result is DMISS (clean), the address/command generation circuit ACG3 outputs a bank active command AC, a prefetch command RF, a read command RD, and a precharge command PRE to the MEM0. At that time, the read source SORS is the processed data cache memory DCH and the DRAM read latency RLAT become 6 and the read power RPW becomes 1.0.

If the check result is DMISS (dirty), the address/command generation circuit ACG3 outputs a bank active command AC, a prefetch command RF, a read command RD, a precharge command PRE, a restore command RT, another band active command AC, and another precharge command PRE to the MEM0. At that time, the read source SORS is the data cache memory DCH and the DRAM read latency RLAT become 6 and the read power RPW becomes 1.8.

FIG. 30B shows a sequence of commands for writing data, which are output from the address/command generation circuit ACG to the memory module MEM0 according to the result of each hit check described with reference to FIG. 29.

If the check result is DHIT, the address/command generation circuit ACG3 outputs a write command to the MEM0. At that time, the write destination DEST is the hit processed data cache memory DCH and the DRAM read latency WLAT become 0 and the write power WPW becomes 0.25.

If the check result is DMISS (clean), the address/command generation circuit ACG3 outputs a bank active command AC, a prefetch command RF, a write command RD, and a precharge command PRE to the MEM0. At that time, the write destination DEST is the missed processed data cache memory DCH and the DRAM write latency WLAT become 4 and the write power WPW becomes 1.0.

If the check result is DMISS (dirty), the address/command generation circuit ACG3 outputs a bank active command AC, a prefetch command RF, a write command RD, a precharge command PRE, a restore command RT, another bank active command AC, and another prefetch command PRE to the MEM. At that time, the write destination DEST is a spare cache memory and the DRAM write latency WLAT become 4 and the write power WPW becomes 1.8.

As described above, because a DRAM built-in cache memory is allocated to each data attribute (command/data) the data in any cache memory is not updated by any data attribute change. Thus, each cache memory is controlled optimally for each data attribute. In addition, each cache memory DCH is provided with a spare cache memory and controlled just as described with reference to FIGS. 11 and 12, so that accesses to the DRAM module are speeded up.

Fifth Embodiment

Figure 31:
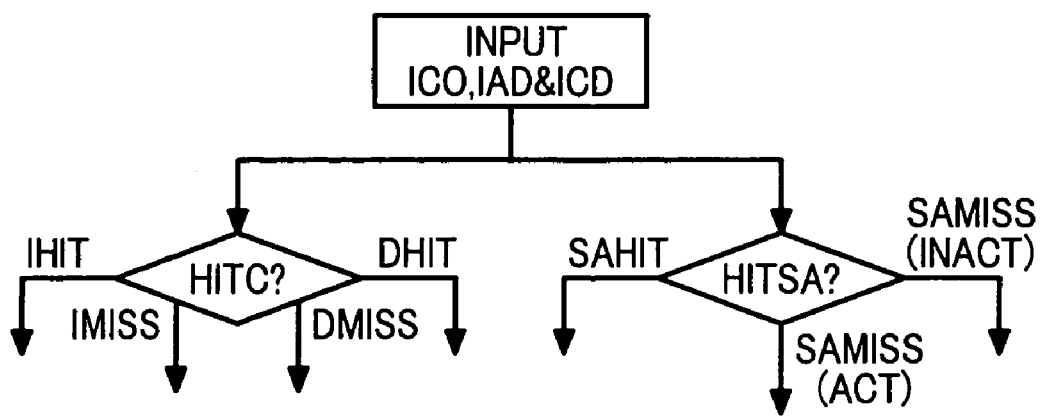
FIG. 31 is a hit check operation performed by the hit check circuit HJ3.

FIG. 31 shows a hit check performed by the memory control unit MCU3 for each of built-in cache memories and sense amplifiers.

When a command ICOM, an address IAD, and a data attribute are inputted to the memory control unit MCU3, the hit check circuit HJ3 in the memory control unit MCU3 makes a hit check for each of cache memories and sense amplifiers.

When the subject data attribute is a command, hit checks are made for the cache memory group ICH consisting of cache memories CH8 to CH15. When the data attribute is processed data, hit checks are made for the cache memory group DCH consisting of cache memories CH0 to CH7. If the cache memory group ICH is hit, the memory control unit MCU3 outputs IHIT. If the ICH is missed, the memory control unit MCU3 outputs IMISS. If the cache memory group DCH is hit, the memory control unit MCU3 outputs DHIT. If the DCH is missed, the memory control unit MCU3 outputs DMISS. All of the IHIT, IMISS, DHIT, and DMISS are output to the address/command generation circuit ACG.

The hit check circuit HJ3 in the memory control unit MCU3 also makes a hit check for the sense amplifier at that time. If the sense amplifier is hit, the memory control unit MCU3 outputs SAHIT. If the sense amplifier is missed, the memory control unit MCU3 outputs SAMISS (ACT). If the missed sense amplifier is inactive, the memory control unit MCU3 outputs SAMISS (INACT) to the address/command generation circuit ACG respectively.

FIG. 32A shows a sequence of commands for writing data, which are output by the address/command generation circuit ACG to the memory module MEM0 according to the result of each hit check described with reference to FIG. 31.

When the check results are DHIT and SAHIT (ACT), the address/command generation circuit ACG3 outputs a write command WT and a restore command RT to the MEM0. At that time, the hit processed data cache memory WCH and the memory cell array ARY become the write destinations DEST and the DRAM write latency WLAT becomes 0 and the write power WPW becomes 0.35.

When the check results are DHIT and SAMISS (ACT), the address/command generation circuit ACG3 outputs a write command WT, a precharge command PRE, a restore command RT, and a bank active command AC to the MEM0. At that time, the hit processed data cache memory DCH and the memory cell array ARY become the write destinations DEST and the DRAM write latency WLAT becomes 0 and the write power WPW becomes 0.9.

When the check results are DHIT and SAMISS (INACT), the address/command generation circuit ACG3 outputs a write command WT, a restore command RT, and a bank active command AC to the MEM0. At that time, the hit processed data cache memory DCH and the memory cell array ARY become the write destinations DEST and the DRAM write latency WLAT becomes 0 and the write power WPW becomes 0.8.

If the check results are DMISS and SAHIT (ACT), the address/command generation circuit ACG3 outputs a prefetch command PRE, a write command WT, and a restore command RT to the MEM0. At that time, the hit processed data cache memory DCH becomes the write destination DEST and the DRAM write latency WLAT becomes 2 and the write power WPW becomes 0.5.

If the check results are DMISS and SAMISS (ACT), the address/command generation circuit ACG3 outputs a precharge command PRE, a bank active command AC, a prefetch command RF, a write command WT, and a restore command RT to the MEM0. At that time, the hit processed data cache memory DCH becomes the write destination DEST and the DRAM write latency WLAT becomes 6 and the write power WPW becomes 1.0.

If the check results are DMISS and SAMISS (INACT), the address/command generation circuit ACG3 outputs a bank active command AC, a prefetch command PRE, a write command WT, and a restore command RT to the MEM0. At that time, the hit processed data cache memory DCH becomes the write destination DEST and the DRAM write latency WLAT becomes 6 and the write power WPW becomes 0.9.

FIG. 32B shows a sequence of commands for reading data, which are output from the address/command generation circuit ACG to the memory module MEM0 according to each hit check result described with reference to FIG. 31.

If the check result is IHIT, the address/command generation circuit ACG3 outputs a read command RD to the MEM0. At that time, the hit command cache memory ICH becomes the read source SORS and the DRAM read latency RLAT becomes 2 and the read power EPW becomes 0.25.

If the check result is DHIT, the address/command generation circuit ACG3 outputs a read command RD to the MEM0. At that time, the hit processed data cache memory DCH becomes the read source SORS and the DRAM read latency RLAT becomes 2 and the read power EPW becomes 0.25.

If the check results are DMISS and SAHIT (ACT), the address/command generation circuit ACG3 outputs a prefetch command PRE and a read command RD to the MEM0. At that time, command cache memories ICH and DCH become the read sources SORS and the DRAM read latency RLAT becomes 4 and the read power RPW becomes 0.5.

If the check results are IMISS, DMISS, and SAMISS (ACT) the address/command generation circuit ACG3 outputs a precharge command PRE, a bank active command AC, a prefetch command PRE and a read command RD to the MEM0. At that time, a data cache memory DCH becomes the read source SORS and the DRAM read latency RLAT becomes 8 and the read power RPW becomes 1.0.

If the check results are IMISS, DMISS, and SAMISS (INACT), the address/command generation circuit ACG3 outputs a bank active command AC, a prefetch command PRE, and a read command RD to the MEM0. At that time, the data cache memory DCH becomes the read source SORS and the DRAM read latency RLAT becomes 6 and the read power RPW becomes 0.9.

As described above, because a DRAM built-in cache memory is allocated to each data attribute (command/data) the data in any cache memory is not updated by any data attribute change. Thus, each cache memory is controlled optimally for each data attribute. In addition, when data is written in a cache memory DCH, the sense amplifier is activated and the data is always written back to the memory cell array ARY, thereby data matching is kept between each cache memory DCH and the memory cell array faster and at lower power consumption.

When data is read from a cache memory, the sense amplifier is activated, thereby the data is read faster and at lower power consumption.

Also upon determining if the data requested from said central processing unit is a command code or processed data by the control unit, a hit check could be perfomed to cache memory when the requested data is a command code, and a hit check could be performed against the sense amplifier memory when the requested data is processed data.

While the CPU, the information processing block configured by primary cache memories and the memory control unit may be formed separately on different semiconductor chips, they may be formed on a single semiconductor chip. In this connection, the information processing unit formed on the chip can employ a wider bus than that employed when the data bus DQ is formed respectively on different semiconductor chips. In addition, the distance between the processing unit and the DQ bus is shortened, so that data is transferred between them faster.

Furthermore, it is also possible to have only the memory control unit designed by another person or form it on the same semiconductor chip together with an existing information processing block so as to realize a one-chip information processing unit.

In this connection, the block diagrams of the circuits of the memory control unit, etc. are recorded on a recording medium and supplied to the designer of the information processing block or information processing unit.

If semiconductor devices are to be manufactured, it is possible to combine the memory control unit or both of the memory control unit and the memory unit of the present invention with an information processing block supplied by another party to realize a system to be provided together with the manufactured semiconductor devices.

On the other hand, the memory control unit may also be provided in the memory module. If the memory control unit is formed in the information processing unit or memory module, the load of the information processing system is reduced, thereby the information processing system is reduced in size.

It is also possible to form part or whole of the memory module on the same semiconductor chip as that of the information processing unit in adjustment to the progress of the manufacturing process of semiconductor devices. In other words, it is to realize a one-chip information processing system that can be reduced more in size.

It is also possible to enable the CPU function like a software program so as to operate the memory control circuit. Even when the memory module and the information processing block are not formed on the same semiconductor chip, the CPU may be allowed to function like a software program to operate the memory control unit.

In such a case, however, the CPU load, for example, for comparing addresses will increase, thereby other CPU processes might slow down, although there is no need to add any other circuits to the CPU.

The present invention can also obtain the same effect as described above in another configuration without adding any circuit to the CPU.

Figure 33A:
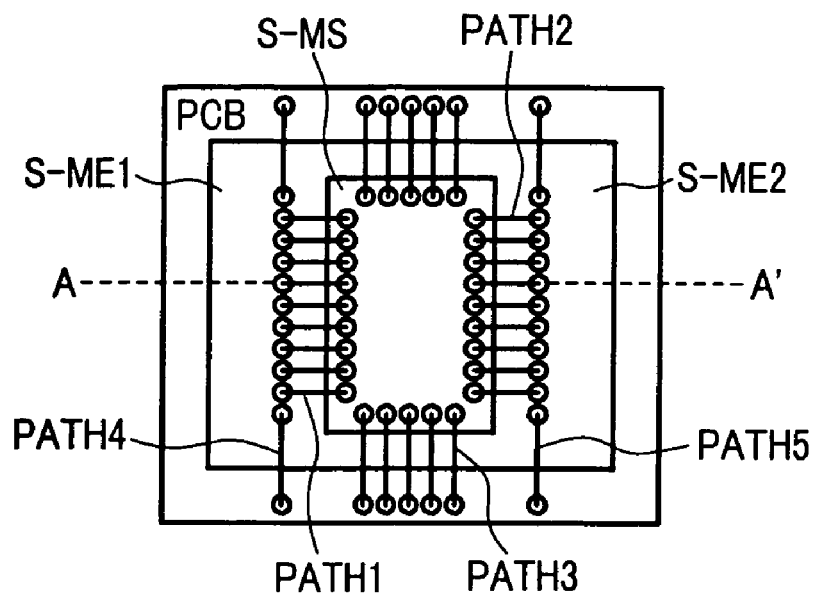
FIG. 33 is a multiple chip module of the present invention.
Figure 33B:
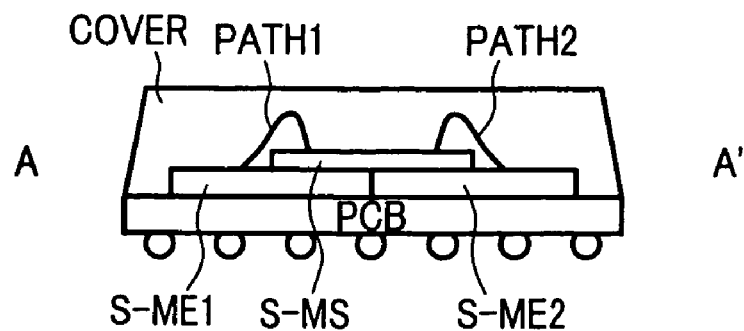

As shown in FIG. 33, a single chip information processing unit S-MS and a module configured by single chip memory units (S-ME1 and S-ME2) may be formed as a semiconductor device sealed in one package. This configuration is well known as a multiple-chip module or multiple-chip package.

While a description has been made for some embodiments of a fast operation information processing system, the present invention is not limited only to those embodiments; it is to be understood that modifications will be apparent to those skilled in the art without departing from the spirit of the invention.

While the memory module includes a plurality of banks in the first, third, fourth, and fifth embodiments, the information processing system may use a memory module that includes no memory bank. And, the memory unit in such an information processing system can be accessed faster.

According to the present invention, therefore, it is possible to distinguish DRAM built-in cache memories between regular cache memories to be subjected to hit checks and spare cache memories not to be subjected to hit checks and transfer requested data to a spare cache memory first according to the result of the hit/miss check in each cache memory, then transfer the data to the memory cell array, thereby operating each DRAM with built-in cache memories faster and at lower power consumption.

Furthermore, because sense amplifiers are also used as cache memories, each DRAM with built-in cache memories is operated faster and at lower power consumption.

What is claimed is:

1. A memory controlling method for an information processing system having a CPU, a memory controller being supplied a read request from the CPU, and a memory unit controlled by the memory controller and being provided with a memory bank and a plurality of cache memories allocated against the memory bank, one of the plurality of cache memories being not subject to a hit check operation, the method comprising the steps of:

reading out data from the memory bank to the one of the plurality of cache memories which is not subject to the hit check operation;

writing back data stored in another one of the plurality of cache memories which is subject to the hit check operation to the memory bank; and changing the one of the plurality of cache memories which is not subject to the hit check operation so as to be subject to the hit check operation and the another one of the plurality of cache memories which is subject to the hit check operation so as to be not subject to the hit check operation.

2. A memory controlling method according to claim 1, wherein the memory bank is a non-volatile memory.

3. A memory controlling method according to claim 1, wherein the plurality of cache memories are non-volatile memories.

4. A memory controlling method according to claim 1, wherein the plurality of cache memories are volatile memories.

5. A memory controlling method for an information processing system having a plurality of cache memories allocated against a memory bank wherein a first cache memory of the plurality of cache memories is in a first status in which the first cache memory acts as a spare cache memory and is not subject to a hit check operation and a second cache memory of the plurality of cache memories is in a second status in which the second cache memory is subject to a hit check operation, the method comprising the steps of:

reading out data from the memory bank to the first cache memory in the first status, writing back data from the second cache memory in the second status to the memory bank, changing the status of the first cache memory from the first status to the second status and changing the status of the second cache memory from the second status to the first status so that the second cache memory acts as the spare cache memory.

6. A memory controlling method according to claim 5, wherein the memory bank is a non-volatile memory.

7. A memory controlling method according to claim 5, wherein the plurality of cache memories are non-volatile memories.

8. A memory controlling method according to claim 5, wherein the plurality of cache memories are volatile memories.

9. In an information processing system having a plurality of cache memories allocated against a memory bank, a method comprising the steps of:

providing a first cache memory in a first status in which the first cache memory acts as a spare cache memory which is not subject to a hit check operation;

providing a second cache memory in a second status in which the second cache memory is subject to a hit check operation;

reading out data from the memory bank to the first cache memory;

writing back data from the second cache memory to the memory bank; and changing the status of the first cache memory from the first status to the second status and changing the status of the second cache memory from the second status to the first status so that the second cache memory acts as the spare cache memory.

10. The method according to claim 9, wherein the step of writing is performed after the step of reading.

11. A memory controlling method according to claim 9, wherein the memory bank is a non-volatile memory.

12. A memory controlling method according to claim 9, wherein the plurality of cache memories are non-volatile memories.

13. A memory controlling method according to claim 9, wherein the plurality of cache memories are volatile memories.

* * * * *